(12) United States Patent
Yano et al.

(10) Patent No.: US 7,455,901 B2
(45) Date of Patent: Nov. 25, 2008

(54) FIBER-REINFORCED COMPOSITE MATERIAL, METHOD FOR MANUFACTURING THE SAME AND APPLICATIONS THEREOF

(75) Inventors: Hiroyuki Yano, Kyoto (JP); Junji Sugiyama, Kyoto (JP); Masaya Nogi, Kyoto (JP); Shin-ichiro Iwamoto, Kyoto (JP); Keishin Handa, Kanagawa (JP); Akira Nagai, Ibaraki (JP); Takao Miwa, Ibaraki (JP); Yoshitaka Takezawa, Ibaraki (JP); Toshiyuki Miyadera, Saitama (JP); Takashi Kurihara, Tokyo (JP); Tohru Matsuura, Tokyo (JP); Nobutatsu Koshoubu, Tokyo (JP); Tohru Maruno, Tokyo (JP)

(73) Assignees: Kyoto University, Kyoto-shi (JP); Rohm Co., Ltd., Kyoto-shi (JP); Mitsubishi Chemical Corporation, Tokyo (JP); Hitachi, Ltd., Tokyo (JP); Pioneer Corporation, Tokyo (JP)

( * ) Notice: Subject to any disclaimer, the term of this patent is extended or adjusted under 35 U.S.C. 154(b) by 177 days.

(21) Appl. No.: 11/333,302

(22) Filed: Jan. 18, 2006

(65) Prior Publication Data

US 2006/0182941 A1    Aug. 17, 2006

Related U.S. Application Data

(63) Continuation of application No. PCT/JP2004/010703, filed on Jul. 28, 2004.

(30) Foreign Application Priority Data

Jul. 31, 2003    (JP) .............................. 2003-313223

(51) Int. Cl.
*D04H 1/00*    (2006.01)

(52) U.S. Cl. .................................... 428/292.1; 428/393
(58) Field of Classification Search .............. 428/292.1, 428/393; 524/261; 451/41
See application file for complete search history.

(56) References Cited

U.S. PATENT DOCUMENTS 3,546,143 A * 12/1970 Corbett ........................ 521/79

(Continued)

FOREIGN PATENT DOCUMENTS

DE    100 64 396 A1    7/2002

(Continued)

OTHER PUBLICATIONS

U.S. Appl. No. 11/815,263, filed Aug. 1, 2007, Yano, et al.

*Primary Examiner*—N Edwards
(74) *Attorney, Agent, or Firm*—Oblon, Spivak, McClelland, Maier & Neustadt, P.C.

(57) ABSTRACT

There is provided a fiber-reinforced composite material containing fibers having an average fiber diameter of 4 to 200 nm and a matrix material, the composite material having a visible light transmittance of 60% or more at a wavelength of 400 to 700 nm, which is a conversion value based on a thickness of 50 μm. A fiber-reinforced composite material composed of a matrix material and a fiber aggregate impregnated therewith is provided, in which when a segment length of a bright region corresponding to a pore region of the fiber aggregate is represented by L, which is obtained by statistical analysis of a unidirectional run-length image formed from a binary image obtained by binarization of a scanning electron microscopic image of the fiber aggregate, the total length of segments that satisfy L≧4.5 μm is 30% or less of the total analyzed length. A transparent multilayered sheet, a circuit board, and an optical waveguide are provided which use a transparent substrate formed from this fiber-reinforced composite material.

16 Claims, 15 Drawing Sheets

U.S. PATENT DOCUMENTS

| | | |
|---|---|---|
| 4,742,164 A | 5/1988 | Iguchi et al. |
| 6,103,790 A | 8/2000 | Cavaille et al. |
| 6,110,588 A | 8/2000 | Perez et al. |
| 6,117,545 A | 9/2000 | Cavaille et al. |
| 6,432,347 B1 | 8/2002 | Perez et al. |
| 6,432,532 B2 | 8/2002 | Perez et al. |
| 6,630,231 B2 | 10/2003 | Perez et al. |
| 6,703,497 B1 | 3/2004 | Lodouce et al. |
| 6,723,770 B2 * | 4/2004 | Kuramoto et al. ........... 524/262 |
| 6,960,120 B2 * | 11/2005 | Prasad .................... 451/41 |
| 7,166,661 B2 * | 1/2007 | Kuramoto et al. ........... 524/261 |
| 7,189,775 B2 * | 3/2007 | Tang et al. ................ 524/437 |
| 2004/0012118 A1 | 1/2004 | Perez et al. |
| 2005/0067730 A1 | 3/2005 | Yano et al. |
| 2006/0182941 A1 | 8/2006 | Yano et al. |

FOREIGN PATENT DOCUMENTS

| | | |
|---|---|---|
| EP | 0 897 943 A2 | 2/1999 |
| EP | 1 609 819 A1 | 12/2005 |
| GB | 874326 | 8/1961 |
| JP | 62-36467 | 2/1987 |
| JP | 63-199201 | 8/1988 |
| JP | 4-281017 | 10/1992 |
| JP | 6-347785 | 12/1994 |
| JP | 06-347785 | 12/1994 |
| JP | 7-156279 | 6/1995 |
| JP | 8-49188 | 2/1996 |
| JP | 8-294986 | 11/1996 |
| JP | 08-294986 | 11/1996 |
| JP | 9-207234 | 8/1997 |
| JP | 10-251301 | 9/1998 |
| JP | 11-209401 | 8/1999 |
| JP | 2000-045173 | 2/2000 |
| JP | 2003-155349 | 5/2003 |
| JP | 2004-168944 | 6/2004 |
| WO | WO 93/10172 | 5/1993 |

* cited by examiner

BACTERIAL CELLULOSE

ORIGINAL IMAGE

BINARY IMAGE

STRIPE IMAGE

AND

RUN-LENGTH IMAGE

DISAGGREGATED BACTERIAL CELLULOSE

ORIGINAL IMAGE

BINARY IMAGE

STRIPE IMAGE

AND

RUN-LENGTH IMAGE

BACTERIAL CELLULOSE

BINARY IMAGE

RUN-LENGTH IMAGE

DISAGGREGATED BACTERIAL CELLULOSE

BINARY IMAGE

RUN-LENGTH IMAGE

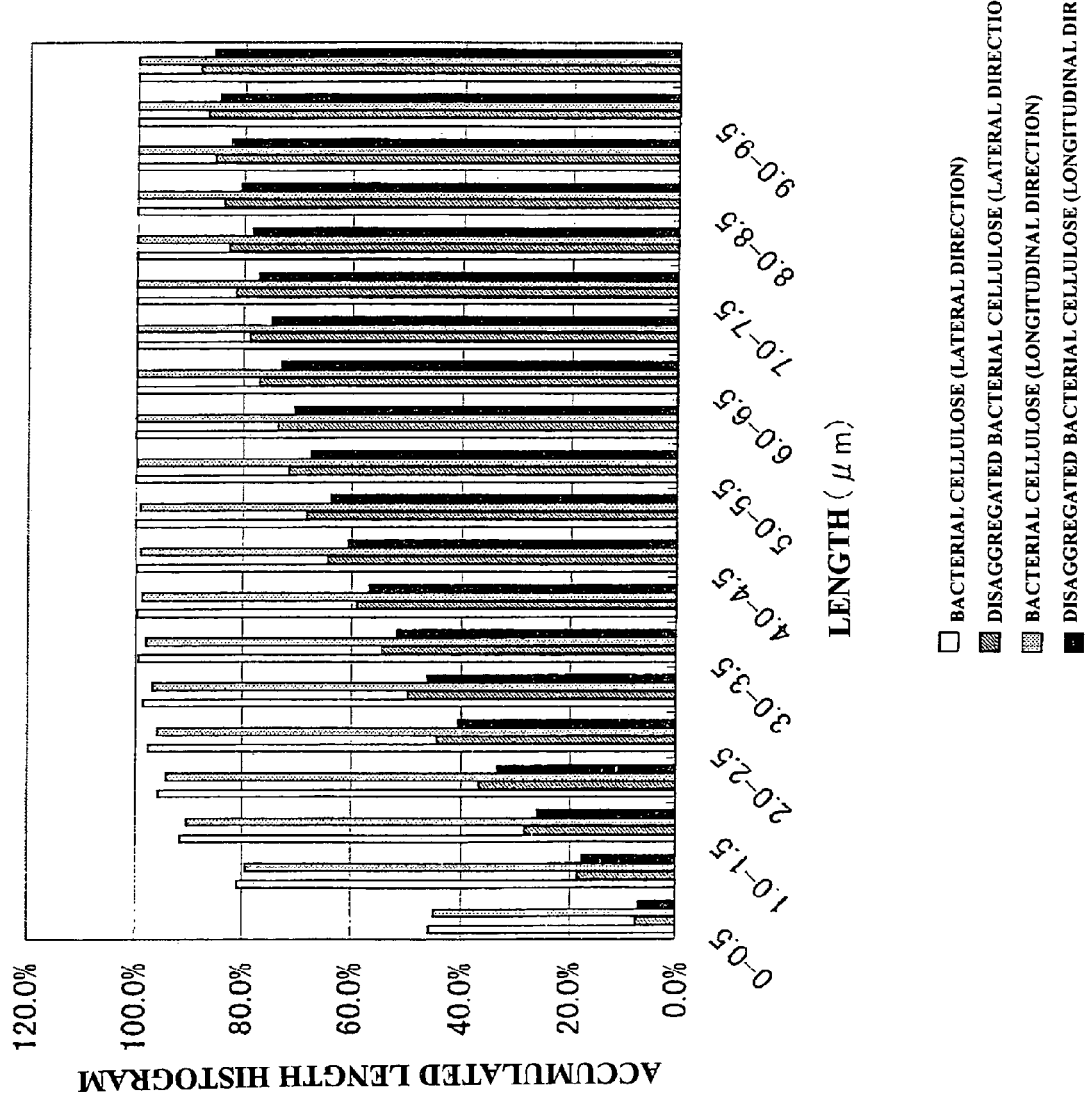

FIBER-REINFORCED COMPOSITE MATERIAL, METHOD FOR MANUFACTURING THE SAME AND APPLICATIONS THEREOF

CROSS REFERENCE TO RELATED APPLICATION

This is a continuation application of PCT/JP2004/010703 filed on Jul. 28, 2004.

FIELD OF THE INVENTION

The present invention relates to a fiber-reinforced composite material and a method for manufacturing the same, and also relates to a transparent multilayered sheet, a circuit board, and an optical waveguide, each of which is formed using the above fiber-reinforced composite material. In more particular, the present invention relates to a highly transparent fiber-reinforced composite material composed of a matrix material and fibers impregnated therewith and a method for manufacturing this fiber-reinforced composite material, and also relates to a transparent multilayered sheet, a circuit board, and an optical waveguide, each of which is formed using a substrate composed of this fiber-reinforced composite material.

BACKGROUND OF THE INVENTION

As the most general fiber-reinforced composite material, a glass fiber-reinforced resin has been known which is composed of a resin and glass fibers impregnated therewith. This glass fiber-reinforced resin is generally opaque. A method for obtaining a transparent glass fiber-reinforced resin has been disclosed in Patent Documents 1 and 2 in which the refractive index of glass fibers is allowed to coincide with the refractive index of a matrix resin.

The presence of some bacteria that produce cellulose fibers has been known. In Patent Documents 3 and 4, there have been disclosed molded materials having various shapes, such as a sheet, a fiber, and a three-dimensional body, which are formed from cellulose fibers (hereinafter referred to as "bacterial cellulose" in some cases) produced by bacteria.

Patent Document 1: Japanese Unexamined Patent Application Publication No. 9-207234
Patent Document 2: Japanese Unexamined Patent Application Publication No. 7-156279
Patent Document 3: Japanese Unexamined Patent Application Publication No. 62-36467
Patent Document 4: Japanese Unexamined Patent Application Publication No. 8-49188

The glass fiber-reinforced resins disclosed in Patent Documents 1 and 2 may become opaque in some cases depending on working conditions. Since the refractive index of a material has a temperature dependence, even when being transparent under certain temperature conditions, the glass fiber-reinforced resins disclosed in Patent Documents 1 and 2 are changed to semitransparent or opaque under conditions different from the above temperature conditions. The refractive index of each material has its own wavelength dependence; hence, even when the refractive index of fibers and that of a matrix resin are allowed to coincide with each other at a specific visible light wavelength, a region in which the refractive index is shifted may probably exist in the entire visible light region, and as a result, in the region described above, the transparency cannot be obtained.

Bacterial cellulose disclosed in Patent Documents 3 and 4 is composed of monofilaments having a fiber diameter of 4 nm, and this fiber diameter is considerably smaller than a visible light wavelength, so that refraction of visible light is unlikely to occur. However, in Patent Documents 3 and 4, when being used to form a composite together with a resin, the bacterial cellulose is disaggregated for the use. When a product produced by bacteria is disaggregated by applying a mechanical shearing force by a grinder or the like, bacterial cellulose fibers are closely attached to each other during a disaggregation process to form bundles having a large fiber diameter which may cause refraction and scattering of visible light, resulting in degradation in transparency of a composite material formed using the disaggregated cellulose as described above.

As described above, as of today, there has not been provided a fiber-reinforced composite material that always maintains superior transparency regardless of temperature conditions and wavelength bands.

In a touch switch, there are generally provided a fixed contact support plate composed of a transparent base material and a transparent conductive film (fixed contact) formed on one surface of the base material and a traveling contact support plate composed of a transparent base material and a transparent conductive film (traveling contact) formed on one surface of the base material. The transparent conductive films of the two support plates are disposed to face each other with a spacer provided therebetween. When being pressed, the traveling contact support plate is curved, and the transparent conductive film which is the traveling contact of the traveling contact support plate and the transparent conductive film which is the fixed contact of the fixed contact support plate are brought into contact with each other.

In general, the base material of the fixed contact support plate is a glass plate or a transparent and insulating sheet of an acrylic resin, polycarbonate resin, polyester resin, or the like, having a thickness of approximately 75 µm to 5 mm. The base material of the traveling contact support plate is a transparent and insulating film or sheet having a thickness of approximately 75 to 200 µm, which is formed using a material similar to that mentioned above. On the base materials described above, transparent conductive films functioning as a contact, circuit patterns, connector lead portions, and the like are formed.

A glass plate is heavy and has an inferior impact resistance. Although being lighter in weight than a glass plate, a resin sheet has the following problems. The transparent conductive film, the circuit pattern, and the like forming the contact on the base material are formed by pattern etching, and in a process for this pattern etching, heat may be applied in some cases. In this case, when the difference in coefficient of linear thermal expansion between the base material and the transparent conductive film is large, by a stress generated at the interface therebetween, damages, such as cracking and peeling, may be done to the transparent conductive film, and as a result, the conductivity may be degraded in some cases by the damages done to the transparent conductive film. When the traveling contact support plate has insufficient flexural strength and/or flexural modulus, the support plate may be deformed or broken by a pressing force repeatedly applied to the plate in operation. Also in this case, the conductivity is degraded due to the degradation of the transparent conductive film.

Accordingly, development of a transparent base material on which a transparent conductive film is formed has been desired, the transparent base material having superior transparency, a light weight, and a small coefficient of linear thermal expansion, causing no damage done to the transparent conductive film due to the coefficient of linear thermal expansion different from that of the transparent conductive film, having high flexural strength and/or flexural modulus, and being capable of sufficiently withstanding a repeatedly applied pressing force.

SUMMARY OF INVENTION

A first object of the present invention is to provide a fiber-reinforced composite material that always maintains superior transparency without being influenced by temperature conditions, wavelengths and the like and that also has various functionalities owing to the composition between fibers and a matrix material.

A second object of the present invention is to provide a transparent multilayered sheet having a transparent conductive layer, the transparent multilayered sheet being capable of always maintaining superior transparency without being influenced by temperature conditions, wavelengths and the like, having a light weight, causing no damage done to the transparent conductive film due to the difference in coefficient of linear thermal expansion between a base material and the transparent conductive film and no degradation in conductivity caused by the above damage, and being capable of withstanding a repeatedly applied stress and the like so as not to cause any breakage problem.

A third object of the present invention is to provide a high performance circuit board using a transparent substrate formed of the fiber-reinforced composite material as described above.

A fourth object of the present invention is to provide a high performance optical waveguide using a transparent substrate formed of the fiber-reinforced composite material as described above.

A fiber-reinforced composite material in accordance with a first aspect of the present invention comprises: a matrix material; and fibers having an average fiber diameter of 4 to 200 nm, wherein a light transmittance at a wavelength of 400 to 700 nm is 60% or more, which is a conversion value based on a thickness of 50 μm.

In the present invention, "light transmittance at a wavelength of 400 to 700 nm, which is a conversion value based on a thickness of 50 μm" (hereinafter referred to as "50 μm-thick visible light transmittance" in some cases) is obtained such that when the fiber-reinforced composite material of the present invention is irradiated with light having a wavelength of 400 to 700 nm in the thickness direction, an average light transmittance (linear-ray transmittance=parallel-ray transmittance) in the entire wavelength region is obtained and is then converted to a value at a thickness of 50 μm. The light transmittance can be obtained by disposing a light source and a detector so as to be perpendicular to a test substrate (sample substrate) which is provided therebetween, and measuring linear transmitting rays (parallel rays) using air as a reference. In particular, measurement can be performed in accordance with a measurement method disclosed in an example which will be described later.

Since this fiber-reinforced composite material contains fibers having an average fiber diameter smaller than a visible light wavelength (380 to 800 nm), the visible light is hardly refracted at the interfaces between the matrix and the fibers. Hence, in the entire visible light region, regardless of refractive indexes of materials, a scattering loss of the visible light hardly occurs at the interfaces between the matrix material and the fibers. Accordingly, in the entire visible light wavelength region, regardless of temperatures, the fiber-reinforced composite material of the present invention has superior transparency: a 50 μm-thick visible light transmittance of 60% or more.

A fiber-reinforced composite material in accordance with a second aspect of the present invention comprises a matrix material; and a fiber aggregate impregnated therewith, in which when a segment length of a bright region corresponding to a pore region of the fiber aggregate is represented by L, which is obtained by statistical analysis of a unidirectional run-length image formed from a binary image obtained by binarization of a scanning electron microscopic image of the fiber aggregate, the total length of segments that satisfy L≧4.5 μm is 30% or less of the total analyzed length.

Hereinafter, when the segment length of a bright region corresponding to a pore region of the fiber aggregate is represented by L, which is obtained by statistical analysis of a unidirectional run-length image formed from a binary image obtained by binarization of a scanning electron microscopic image of the fiber aggregate, the ratio of the total length of segments that satisfy L≧4.5 μm to the total analyzed length is referred to as "≧4.5 μm RL ratio" in some cases.

In the present invention, in more particular, the ≧4.5 μm RL ratio can be obtained by an analysis method disclosed in an example which will be described later.

This fiber-reinforced composite material has superior transparency without being influenced by temperature conditions, wavelengths and the like.

The ≧4.5 μm RL ratio is an index showing the fineness of a run-length image, in other words, the fineness of an aggregation state of fibers of the fiber aggregate. When the ≧4.5 μm RL ratio is large, it means that the fiber aggregation state (network structure) of the fiber aggregate is loose, and pores formed between the fibers are large. On the other hand, when the ≧4.5 μm RL ratio is small, such as 30% or less, it means that a significantly fine and minute network structure of the fibers is formed.

The fiber-reinforced composite material of the present invention is composed of the fiber aggregate impregnated with the matrix material, and this aggregate has a three-dimensional intersection structure having a ≧4.5 μm RL ratio of 30% or less in which nanometer-sized small fibers form a significantly fine and minute network, and hence visible light is hardly refracted at the interfaces between the matrix and the fibers. Hence, in the entire visible light region, regardless of refractive indexes of the materials, a scattering loss of visible light hardly occurs at the interfaces between the matrix and the fibers. Accordingly, regardless of temperatures, in the entire visible light region, the fiber-reinforced composite material of the present invention has superior transparency, such as a 50 μm-thick visible light transmittance of 60% or more.

The fiber-reinforced composite materials in accordance with the first and the second aspects of the present invention can be manufactured by a method for manufacturing a fiber-reinforced composite material, in accordance with a third aspect of the present invention, in which the fibers are impregnated with an impregnating liquid which is capable of forming the matrix material, followed by curing of the impregnating liquid.

Since the fiber-reinforced composite materials in accordance with the first to the third aspects of the present invention may have a low coefficient of linear thermal expansion similar to that of a glass-reinforced resin, even when ambient temperature varies, strain, deformation, and degradation in form accuracy can be suppressed; hence, the fiber-reinforced composite materials described above may be effectively used as an optical material. In addition, since deformation such as flexure and strain can be suppressed, the composite material of the present invention may also be effectively used as a structural material.

The fiber-reinforced composite material of the present invention may have a specific gravity lower than that of a glass-reinforced resin.

Since being able to have a low dielectric constant, the fiber-reinforced composite material of the present invention is effectively used for communication optical fibers and the like.

A transparent multilayered sheet in accordance with a fourth aspect of the present invention comprises: a base material composed of the fiber-reinforced composite material according to the present invention; and a transparent conductive film formed on a surface of the base material.

In the entire visible light wavelength region, regardless of temperatures, the base material made of the fiber-reinforced composite material has superior transparency, that is, has a 50 µm-thick visible light transmittance of 60% or more, and hence superior transparency is imparted to the transparent multilayered sheet.

Since this base material made of the fiber-reinforced composite material is able to have a low coefficient of linear thermal expansion similar to that of a glass-reinforced resin, even when ambient temperature varies, damages, such as cracking or peeling, done to the transparent conductive film provided on the base material can be prevented.

Since having high flexural strength and flexural modulus, the base material made of the fiber-reinforced composite material is hardly deformed or broken by a mechanical stress applied thereto. Hence, damage done to the transparent conductive film caused by deformation of the base material can be prevented, and decrease in electrical conductivity or disappearance thereof caused by the above damage can also be prevented.

A circuit board in accordance with a fifth aspect of the present invention comprises: a transparent substrate composed of the fiber-reinforced composite material of the present invention; and a wiring circuit formed on the transparent substrate.

An optical waveguide in accordance with a sixth aspect of the present invention comprises: a transparent substrate composed of the fiber-reinforced composite material according to the present invention; and a core formed on the transparent substrate.

BRIEF DESCRIPTION OF THE DRAWINGS

FIG. 7 is a graph showing length histograms (accumulated percentage of the total analyzed length) of bacterial cellulose and disaggregated bacterial cellulose obtained by image analysis.

PREFERABLE EMBODIMENTS OF THE INVENTION

Figure 1:
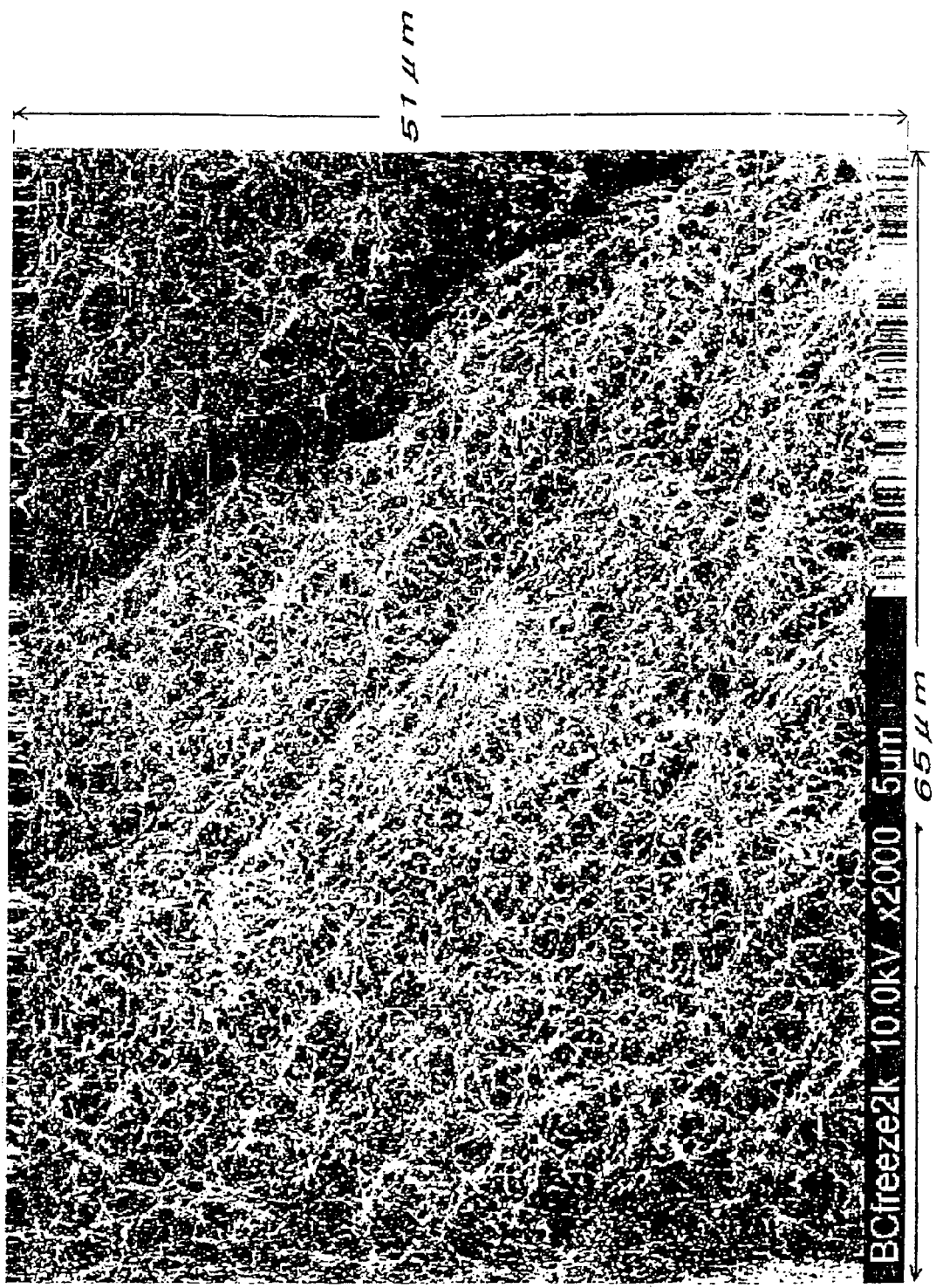
FIG. 1 is a scanning electron microscopic photograph (SEM photograph) of bacterial cellulose obtained in manufacturing example 1.

Hereinafter, the present invention will be described in detail.

[1] Fiber-Reinforced Composite Material and Manufacturing Method Thereof

The fiber-reinforced composite material in accordance with the first aspect contains the fibers and the matrix material, and has a 50 µm-thick visible light transmittance of 60% or more.

According to the first aspect, the average diameter of the fibers is 4 to 200 nm. The fibers may not be composed of drawn and aligned monofilaments and may be composed of monofilaments which are present separately from each other so that spaces therebetween are sufficiently impregnated with the matrix material. In this case, the average fiber diameter is the average diameter of monofilaments. The fiber may be a single yarn-shaped bundle composed of a plurality of (or a great number of) monofilaments, and in this case, the average fiber diameter is defined as the average diameter of the yarn-shaped bundles. The bacterial cellulose is formed of the latter, that is, the yarn-shaped bundles.

When the average diameter of the fibers is more than 200 nm, it is closer to the wavelength of visible light, and as a result, visible light is liable to be refracted at the interfaces with the matrix material. Fibers having an average diameter of less than 4 nm are difficult to produce. The diameter of monofilaments of bacterial cellulose to be described later which is suitably used as the fibers is approximately 4 nm. The average diameter of the fibers is preferably in the range of 4 to 100 nm and more preferably in the range of 4 to 60 nm.

The fibers used in the first aspect may include fibers having an average fiber diameter of 4 to 200 nm, which is out of the above range; however, the ratio thereof is preferably set to 30 percent by weight or less. The fiber diameters of all the fibers are preferably 200 nm or less, more preferably 100 nm or less, and even more preferably 60 nm or less.

The fiber-reinforced composite material in accordance with the second aspect contains the fiber aggregate impregnated with the matrix material and has a $\geqq 4.5$ μm RL ratio of 30% or less.

When the $\geqq 4.5$ μm RL ratio of the fiber aggregate used in the second aspect is more than 30%, the network structure of the fiber aggregate becomes loose, and as a result, a highly transparent fiber-reinforced composite material cannot be obtained. As the $\geqq 4.5$ μm RL ratio is decreased, the transparency of the fiber-reinforced composite material is improved, and the $\geqq 4.5$ μm RL ratio is preferably 20% or less, more preferably 10% or less, even more preferably 5% or less, and most preferably 1% or less.

As shown in an example which will be described later, the measurement of the $\geqq 4.5$ μm RL ratio can be analyzed, for example, by a run-length image in two directions, that is, one direction (lateral direction) and the other direction (longitudinal direction) perpendicular thereto. According to the second aspect, in at least one of the two directions described above, the $\geqq 4.5$ μm RL ratio of the fiber aggregate is 30% or less, preferably 20% or less, more preferably 10% or less, even more preferably 5% or less, and most preferably 1% or less. However, further preferably, in the two directions described above, the $\geqq 4.5$ μm RL ratio is 30% or less, is preferably 20% or less, more preferably 10% or less, even more preferably 5% or less, and most preferably 1% or less.

Fibers forming the fiber aggregate having a $\geqq 4.5$ μm RL ratio of 30% or less are preferably fibers having an average fiber diameter of 4 to 200 nm, more preferably cellulose fibers, and even more preferably bacterial cellulose; however, the fibers are not limited to those mentioned above.

The fibers may not be composed of drawn and aligned monofilaments and may be composed of monofilaments which are present separately from each other so that spaces therebetween are sufficiently impregnated with the matrix material. In this case, the average fiber diameter is the average diameter of monofilaments. In addition, the fiber in accordance with the second aspect may be a single yarn-shaped bundle composed of a plurality of (or a great number of) monofilaments, and in this case, the average fiber diameter is defined as the average diameter of the yarn-shaped bundles. The bacterial cellulose is formed of the latter, that is, the yarn-shaped bundles.

In the second aspect, when the average diameter of the fibers is more than 200 nm, a fiber aggregate having a $\geqq 4.5$ μm RL ratio of 30% or less is difficult to obtain, and in addition, since the fiber diameter becomes closer to the wavelength of visible light, visible light is liable to be refracted at the interfaces with the matrix material. As a result, the transparency of the fiber-reinforced composite material to be obtained is degraded, and hence the upper limit of the average diameter of the fibers used in the second aspect is preferably set to 200 nm. Fibers having an average diameter of less than 4 nm are difficult to produce, and for example, since a monofilament diameter of bacterial cellulose, which will be described later, suitably used as the fibers is approximately 4 nm, the lower limit of the fibers used in the second aspect is preferably set to 4 nm. The average diameter of the fibers used in the second aspect is more preferably in the range of 4 to 100 nm and even more preferably in the range of 4 to 60 nm.

The fibers used in the second aspect may include fibers having an average fiber diameter of 4 to 200 nm, which is out of the above range; however, the ratio thereof is preferably set to 30 percent by weight or less. The fiber diameters of all the fibers are preferably 200 nm or less, more preferably 100 nm or less, and even more preferably 60 nm or less.

The length of the fibers used in the first and the second aspects is not particularly limited; however, the average length is preferably 100 nm or more. When the average length of the fibers is less than 100 nm, the reinforcing effect is not significant, and the strength of the fiber-reinforced composite material may be insufficient in some cases. Fibers having a length of less than 100 nm may be contained in the fibers; however, the ratio thereof is preferably set to 30 percent by weight or less.

In the first and the second aspects, when cellulose fibers are used as the fibers, it is preferable as described later since the coefficient of linear thermal expansion of a fiber-reinforced composite material to be obtained can be decreased.

The cellulose fibers are microfibrils of cellulose, which form base skeletons or the like of plant cell walls, or fibers constituting the microfibrils and are aggregates of monofilaments generally having a diameter of approximately 4 nm. Cellulose fibers having 40% or more of a crystal structure are preferably used in order to obtain a high strength and a low thermal expansion.

The cellulose fibers used in the present invention may be isolated from plants; however, bacterial cellulose produced from bacterial cellulose is suitably used. Bacterial cellulose is obtained by processing a product produced from bacteria by alkaline treatment so as to remove bacteria by dissolution, and bacterial cellulose which is not disaggregated is preferably used to obtain a fiber aggregate having a 50 μm-thick visible light transmittance of 60% or more or having a $\geqq 4.5$ μm RL ratio of 30% or less.

As living organisms on the earth that are able to produce cellulose, in addition to living organisms in Plantae, for example, there may include sea squirts in Animalia; various algae, oomycetes, myxomycetes and the like in Protista; and blue-green algae, some acetic acid bacteria and some soil bacteria in Monera. As of today, in Mycota (true fungi), living organisms that are able to produce cellulose have not been confirmed. Of the acetic acid bacteria, the genus *Acetobacter* may be mentioned, and more particularly, for example, *Acetobacter aceti, Acetobacter* subsp., and *Acetobacter xylinum* may be mentioned; however, the acetic acid bacteria are not limited thereto.

By culturing the bacteria as described above, cellulose is produced therefrom. Since the product thus obtained contains bacteria and cellulose fibers (bacterial cellulose) connected to the bacteria from which the fibers are produced, this product is recovered from a culture medium, followed by removal of the bacteria by washing with water or alkaline treatment, so that hydrated bacterial cellulose containing no bacteria can be obtained. When this hydrated bacterial cellulose is dehydrated, bacterial cellulose can be obtained.

As a culture medium, for example, an agar solid culture medium or a liquid culture medium (culture fluid) may be mentioned. As the culture fluid, for example, there may be mentioned a culture fluid having a pH of 3.0 adjusted using acetic acid and including 7 percent by weight of coconut milk (0.7 percent by weight of total nitrogen component and 28 percent by weight of lipid) and 8 percent by weight of sucrose, or an aqueous solution (SH culture medium) having a pH of 5.0 adjusted using hydrochloric acid and including 2 percent by weight of glucose, 0.5 percent by weight of bactoyeast extract, 0.5 percent by weight of bactopeptone, 0.27 percent by weight of disodium hydrogenphosphate, 0.115 percent by weight of citric acid, and 0.1 percent by weight of magnesium sulfate heptahydrate.

As a culture method, for example, the following may be mentioned. After an acetic acid bacterium such as *Acetobacter xylinum* FF-88 or the like is inoculated into a coconut milk culture fluid, for example, in the case of FF-88, stationary culture is performed for 5 days at 30° C., so that a primary culture fluid is obtained. After a gel component is removed from the primary culture fluid thus obtained, a liquid component is added to a culture fluid similar to that described above at a ratio of 5 percent by weight, followed by stationary culture for 10 days at 30° C., thereby obtaining a secondary culture fluid. In this secondary culture fluid, approximately 1 percent by weight of cellulose fibers is contained.

As another culture method, a method using an aqueous solution (SH culture fluid) having a pH of 5.0 adjusted by hydrochloric acid as a culture fluid may be mentioned, the aqueous solution containing 2 percent by weight of glucose, 0.5 percent by weight of bactoyeast extract, 0.5 percent by weight of bactopeptone, 0.27 percent by weight of disodium hydrogenphosphate, 0.115 percent by weight of citric acid, and 0.1 percent by weight of magnesium sulfate heptahydrate. In the case described above, the SH culture fluid is added to a strain of acetic acid bacteria stored in a freeze-dried state, followed by stationary culture for 1 week (25 to 30° C.). On the surface of the culture fluid, bacterial cellulose is produced, and after a relatively thick part of the bacterial cellulose thus produced is selected, a small amount of the culture fluid thereof is sampled and is then added to a new culture fluid. Subsequently, this culture fluid is placed in a large incubator, followed by stationary culture for 7 to 30 days at 25 to 30° C. As described above, bacterial cellulose can be obtained by repeatedly performing a process: "a part of an existing culture fluid is added to a new culture fluid, followed by stationary culture for approximately 7 to 30 days".

When a problem arises in that cellulose is not easily produced by bacteria, the following procedure is carried out. A small amount of a culture fluid in which the bacteria is being cultured is sprayed onto an agar culture medium formed by adding an agar to a culture fluid and is then allowed to stand for approximately 1 week, so that colonies are formed. After the individual colonies thus formed are observed, a colony which may effectively produce cellulose is recovered from the agar culture medium and is then added to a new culture fluid to perform culture.

Bacterial cellulose thus produced is recovered from the culture fluid, and remaining bacteria in the bacterial cellulose are removed. As a removing method, for example, water washing or alkaline treatment may be mentioned. As alkaline treatment for removing bacteria by dissolution, for example, a method may be mentioned in which bacterial cellulose recovered from a culture fluid is immersed in an aqueous alkaline solution at an alkaline concentration of approximately 0.01 to 10 percent by weight for 1 hour or more. When alkaline treatment is performed, after bacterial cellulose is recovered from an alkaline treatment solution, water washing is sufficiently performed so as to remove the alkaline treatment solution.

The hydrated bacterial cellulose thus obtained (in general, bacterial cellulose containing 95 to 99 percent by weight of water) is then processed by dehydration.

A dehydration method is not particularly limited; however, for example, there may be mentioned a method in which after being allowed to stand or processed by cold press or the like for removing a certain amount of water, cellulose is again allowed to stand or is processed by hot press or the like for removing all the remaining water, or a method in which after cold press, water is removed using a drying machine or by spontaneous drying.

The method in which the cellulose is allowed to stand for removing a certain amount of water is a method for gradually removing water by evaporation for a long period of time.

The cold press mentioned above is a method for removing water by applying pressure without heating, and a certain amount of water can be squeezed out thereby. The pressure used in this cold press is preferably 0.01 to 10 MPa and more preferably 0.1 to 3 MPa. When the pressure is less than 0.01 MPa, the amount of remaining water tends to be large, and when the pressure is more than 10 MPa, obtained bacterial cellulose may be degraded in some cases. The temperature is not particularly limited; however, in consideration of convenient processing, room temperature is preferable.

The method in which the cellulose is allowed to stand for totally removing the remaining water is a method for drying bacterial cellulose for a long period of time.

The hot press mentioned above is a method for removing water by applying pressure with heat, and all the remaining water can be removed. The pressure used in this hot press is preferably 0.01 to 10 MPa and more preferably 0.2 to 3 MPa. When the pressure is less than 0.01 MPa, water may not be removed in some cases, and when the pressure is more than 10 MPa, obtained bacterial cellulose may be degraded in some cases. The temperature is preferably 100 to 300° C. and more preferably 110 to 200° C. When the temperature is less than 100° C., removal of water may take a long time, and when the temperature is more than 300° C., for example, decomposition of bacterial cellulose may occur in some cases.

A drying temperature of the drying machine is preferably 100 to 300° C. and more predetermined 110 to 200° C. When the drying temperature is less than 100° C., water may not be removed in some cases, and when the drying temperature is more than 300° C., for example, decomposition of cellulose fibers may occur in some cases.

Although depending on culture conditions, and/or conditions of pressure, temperature and the like in a subsequent water removal step, the bacterial cellulose thus obtained is generally in the form of a sheet (hereinafter referred to as "BC sheet" in some cases) having a bulk density of approximately 1.1 to 1.3 kg/m$^3$ and a thickness of approximately 40 to 60 µm.

The fiber-reinforced composite material of the present invention may be formed by impregnating one BC sheet or a plurality of BC sheets laminated to each other with an impregnating liquid capable of forming the matrix material.

When the bacterial cellulose used in the present invention is formed into a sheet having a bulk density of 1.2 kg/m$^3$ and a thickness of 40 µm, air permeance measured by a method in accordance with JIS P 8117 is preferably 8,000 sec/100 cc or more, more preferably 10,000 sec/100 cc or more, and even more preferably 15,000 sec/100 cc. A BC sheet having the air permeance as described above can improve the transparency of the fiber-reinforced composite material.

In Patent Documents 3 and 4 described above, in the case of forming a composite material of bacterial cellulose and a resin, a product containing bacterial cellulose is used after disaggregation; however, a sheet obtained from the disaggregated bacterial cellulose has a low air permeance, such as approximately 4,500 sec/100 cc as shown in manufacturing example 2 which will be described later, the air permeance being measured in a manner similar to that described above. The reason for this is that since shearing forces are applied to monofilaments of bacterial cellulose by disaggregation, bacterial cellulose fibers are closely attached to and/or tangled with each other, and as a result, a network structure of the bacterial cellulose becomes loose. A BC sheet having a low air permeance and a loose network structure as described above cannot enable the fiber-reinforced composite material to have sufficient strength and transparency.

Since the bacterial cellulose used in the present invention is not processed by disaggregation treatment as described above, a three-dimensional intersection structure can be formed (hereinafter, bacterial cellulose forming a three-dimensional intersection structure is referred to as "three-dimensional intersection bacterial cellulose structural body" in some cases). This "three-dimensional intersection bacterial cellulose structural body" means "a material body which can be handled as one structural body although having a bulky state (having a sparse state) since bacterial cellulose has a three-dimensional intersection structure" and is produced by culturing bacteria that produce cellulose fibers in a culture medium as described above.

The above state described above is a state in which since bacteria randomly move around while producing (discharging) cellulose fibers, a structure is build by the cellulose fibers which complicatedly (three dimensionally) intersect each other. This complicated intersection becomes further complicated since branches of cellulose are produced as cell division in bacteria occurs.

When being cultured using an appropriate shape such as a film, plate, block, or predetermined shape (such as lens), the three-dimensional intersection bacterial cellulose structural body may be formed in conformity with the shape mentioned above. Hence, in accordance with purposes, a three-dimensional intersection bacterial cellulose structural body having an optional shape can be obtained.

Subsequently, the three-dimensional intersection bacterial cellulose structural body is then processed by alkaline treatment or washing treatment with water for removing bacteria as described above, and by the treatment mentioned above, the three-dimensional intersection of the three-dimensional intersection bacterial cellulose is not degraded. In addition, even when a water component contained in the three-dimensional intersection bacterial cellulose structural body is removed by compression thereof or the like, it has been confirmed that this three-dimensional intersection state can be retained.

When this three-dimensional intersection structure is retained, the strength, the transparency and the like of the composite material (cellulose-matrix material composite material) can be effectively obtained. Since bacterial cellulose forms the three-dimensional intersection bacterial cellulose structural body, the high air permeance described above can be obtained.

In order to further make this three-dimensional intersection bacterial cellulose structural body finer, when a step called disaggregation treatment, defiberization treatment, or the like is performed, that is, when a step of grinding down the three-dimensional intersection bacterial cellulose structural body is performed using a pestle and mortar, an earthenware mortar, a mill or the like, the above three-dimensional intersection structure is destroyed, cellulose fibers are torn into pieces, and short fibers thus formed flock together (congregate together) to form hairball or film shapes. Consequently, it is confirmed that the structure thus formed is completely different from the three-dimensional intersection bacterial cellulose structural body made of nanometer-sized (nanometer-ordered) cellulose fibers in terms of properties and structure.

In the present invention, as the fibers, bacterial cellulose described above is preferably used; however, cellulose may also be used which is obtained from sea weeds, cysts of sea squirts, plant cell walls or the like by treatment such as treatment of beating, pulverizing and/or the like, high temperature/high pressure water vapor treatment, or treatment using a phosphate or the like.

In the case described above, in the treatment of beating, pulverizing and/or the like, beating and/or pulverizing are performed by directly applying a force to plant cell walls, sea weeds, or cysts of sea squirts, from which lignin and the like are removed beforehand, so that fibers are separated from each other, thereby obtaining cellulose fibers.

In more particular, as shown in manufacturing example 3 which will be described later, an aqueous suspension is formed containing approximately 0.1 to 3 percent by weight of microfibrillated cellulose fibers (hereinafter referred to as "MFC") having an average fiber diameter of approximately 0.1 to 10 μm, which are obtained by microfibrillation of pulps or the like using a high pressure homogenizer, and grinding or ultra grinding treatment is further repeatedly performed using a grinder or the like, so that nanometer-ordered MFC (hereinafter simply referred to as "Nano MFC") having an average diameter of approximately 10 to 100 nm can be obtained. After an aqueous suspension containing approximately 0.01 to 1 percent by weight of this Nano MFC is formed and is then filtrated, a sheet thereof is obtained.

The grinding or ultra grinding treatment described above can be performed, for example, by using a grinder manufactured under the trade name "Pure Fine Mill" by Kurita Machinery Mfg. Co., Ltd. or the like.

This grinder is a stone mill type pulverizer in which a raw material is pulverized into ultrafine particles by impact, centrifugal force, and shearing force, which are generated when the raw material passes through a space formed between two grinders disposed in a vertical direction, and by this pulverizer, shearing, grinding, particularization, dispersion, emulsification, fibrillation can be simultaneously performed. The grinding or ultra grinding treatment described above can also be performed by a ultrafine particle grinder manufactured under the trade name "Super Masscolloider" by Masuko Sangyo Co., Ltd. Super Masscolloider is a grinding machine performing ultrafine particularization which can go beyond the concept of pulverization and can obtain a state in which ground particles are as if being melted. Super Masscolloider is a stone mill type ultrafine particle grinder in which two non-porous grinding stones are disposed in a vertical direction with a freely adjustable space provided therebetween, the upper side grinding stone is fixed, and the lower side grinding stone rotates at a high speed. A raw material charged into a hopper is supplied by a centrifugal force to the space between the two grinding stones and is then gradually ground by significantly high compression, shearing, rolling friction forces generated therebetween, thereby performing ultrafine particularization.

The high temperature/high pressure vapor treatment described above is a treatment method for obtaining cellulose fibers, the method including the step of exposing sea weeds, cysts of sea squirts, or plant cell walls, from which lignin and the like are removed beforehand, to high temperature/high pressure water vapor so that the fibers are separated from each other.

The treatment using a phosphate or the like is a treatment method for obtaining cellulose fibers, the method including the steps of performing phosphate esterification of surfaces of sea weeds, cysts of sea squirts, plant cell walls or the like so as to decrease bonding forces between cellulose fibers, then performing refiner treatment so that fibers are separated from each other. After plant cell walls, sea weeds, or cysts of sea squirts, from which lignin and the like are removed beforehand, are immersed in a solution containing 50 percent by weight of urea and 32 percent by weight of phosphoric acid so as to be sufficiently impregnated therewith at 60° C., phosphorylation is promoted at 180° C. by heating. After washing with water, hydrolysis treatment is performed in an aqueous hydrochloric acid solution at a concentration of 3 percent by weight for 2 hours at 60° C., and again washing is performed with water. Subsequently, treatment is performed in an aqueous sodium carbonate solution at a concentration of 3 percent by weight for 20 minutes at room temperature so as to complete the phosphorylation. Next, the material thus treated is defiberized by a refiner, thereby obtaining cellulose fibers.

As the fibers used in the present invention, the cellulose fibers as described above may be further chemically and/or physically modified to improve their functionality. In this case, as the chemical modifications, for example, there may be mentioned addition of a functional group, such as acetylation, cyanoethylation, acetalization, etherification, isocyanation, or the like; composition with an inorganic material, such as silicate and titanate, using a chemical reaction, a sol-gel method or the like; and coating using the same inorganic material as described above. As a chemical modification method, for example, as shown in manufacturing example 5 which will be described later, a method may be mentioned in which a BC sheet (or a Nano MFC sheet may be used instead) is immersed in acetic anhydride and is heated. By acetylation, without degrading the light transmittance, decrease in water-absorbing properties and improvement in heat stability can be realized. As the physical modifications, for example, there may be mentioned physical vapor deposition (PVD), such as vacuum deposition, ion plating, and sputtering; chemical vapor deposition (CVD); and plating methods such as electroless plating and electrolytic plating. By the methods mentioned above, surface coating can be performed using a metal and/or a ceramic raw material.

The various types of fibers described above may be used alone or in combination.

The content of the fibers in the fiber-reinforced composite material is preferably 10 percent by weight or more, more preferably 30 percent by weight or more, and even more preferably 50 percent by weight or more, and is preferably 99 percent by weight or less and more preferably 95 percent by weight or less. When the content of the fibers in the fiber-reinforced composite material is excessively small, improvement in flexural strength and flexural modulus by fibers such as cellulose fibers or an effect of decreasing the coefficient of linear thermal expansion tends to become insufficient, and when the content is excessively large, adhesion between the fibers or filling of spaces between the fibers by the matrix material becomes insufficient, and as a result, the strength, transparency, and surface flatness may be degraded in some cases.

As the matrix material of the fiber-reinforced composite material of the present invention, at least one material selected from the group consisting of an organic polymer, an inorganic polymer, and a hybrid polymer of an organic polymer and an inorganic polymer is suitably used.

Hereinafter, the matrix materials suitably used in the present invention will be described by way of example; however, the matrix materials used in the present invention are not limited thereto.

The inorganic polymers used as the matrix material may include, for example, ceramics such as a glass, a silicate material, and a titanate material, and they can be formed, for example, by dehydration condensation reaction of alcoholate. The organic polymers may include natural polymers and synthetic polymers.

The natural polymers may include, for example, triacetyl cellulose and a regenerated cellulose-based polymer such as cellophane.

The synthetic resins may include, for example, a vinyl resin, a polycondensation resin, a polyaddition resin, an addition condensation resin and a ring-opening polymerization resin.

The vinyl resin may include, for example, a common resin such as a polyolefin, a vinyl chloride resin, a vinyl acetate resin, a fluorinated resin, or a (meth)acrylic resin; or engineering plastic or super engineering plastic formed by vinyl polymerization. These resins may be homopolymers each formed from one type of constituent monomer or may be copolymers.

The polyolefin may include, for example, a homopolymer formed from ethylene, propylene, styrene, butadiene, butene, isoprene, chloroprene, isobutylene, isoprene, or the like; a copolymer thereof; or a cyclic polyolefin having a norbornene structure.

The vinyl resin may include a homopolymer containing vinyl chloride, vinylidene chloride, or the like or a copolymer thereof.

The vinyl acetate resin may include, for example, poly(vinyl acetate) which is a homopolymer of vinyl acetate, poly(vinyl alcohol) which is a hydrolyzed product of poly(vinyl acetate), poly(vinyl acetal) which is a reaction product of vinyl acetate with formaldehyde or n-butyl aldehyde, and poly(vinyl butyral) which is a reaction product of poly(vinyl alcohol) with butyl aldehyde or the like.

The fluorinated resin may include a homopolymer of tetrachlorethylene, hexafluoroethylene, chlorotrifluoroethylene, vinylidene fluoride, vinyl fluoride, perfluoroalkyl vinyl ether or the like and a copolymer thereof.

The above (meth)acrylic resin may include a homopolymer of (meth)acrylic acid, (meth)acrylonitrile, (meth)acrylate, (meth)acrylamide, or the like and a copolymer thereof. The "(meth)acrylic" means "acrylic and/or methacrylic". In this embodiment, as the (meth)acrylic acid, acrylic acid or methacrylic acid may be mentioned. In addition, as the (meth)acrylonitrile, acrylonitrile or methacrylonitrile may be mentioned. As the (meth)acrylate, alkyl(meth)acrylate, (meth)acrylic acid-based monomer having a cycloalkyl group, or alkoxyalkyl(meth)acrylate may be mentioned. As the alkyl (meth)acrylate, for example, there may be mentioned methyl (meth)acrylate, ethyl(meth)acrylate, butyl (meth)acrylate, 2-ethylhexyl(meth)acrylate, cyclohexyl (meth)acrylate, benzyl(meth)acrylate, lauryl(meth)acrylate, stearyl(meth)acrylate, or hydroxyethyl(meth)acrylate. As the (meth)acrylic acid-based monomer having a cycloalkyl group, for example, cyclohexyl(meth)acrylate or isbornyl(meth)acrylate may be mentioned. As the alkoxyalkyl(meth)acrylate, for example, 2-methoxyethyl(meth)acrylate, 2-ethoxyethyl(meth)acrylate, or 2-butoxyethyl(meth)acrylate may be mentioned. As the (meth)acrylamides, for example, (meth)acrylamide and N-substituted(meth)acrylamides such as N-methyl(meth)acrylamide, N-ethyl(meth)acrylamide, N,N-dimethyl(meth)acrylamide, N,N-diethyl(meth)acrylamide, N-isopropyl (meth)acrylamide, and N-t-octyl(meth)acrylamide may be mentioned.

The above polycondensation resin may include, for example, an amide resin or polycarbonate.

The amide resin may include, for example, an aliphatic amide resin such as 6,6-nylon, 6-nylon, 11-nylon, 12-nylon, 4,6-nylon, 6,10-nylon, or 6,12-nylon, or an aromatic amide resin produced from an aromatic diamine such as phenylene diamine and an aromatic dicarboxylic acid such as terephthaloyl chloride, isophthaloyl chloride or a derivative thereof.

The above polycarbonate is a reaction product between bisphenol A or a derivative thereof, that is, a bisphenol derivative, and phosgene or phenyl dicarbonate.

The above polyaddition resin may include, for example, an ester resin, U polymer, liquid crystal polymer, poly(ether ketone) derivative, poly(ether ether ketone), unsaturated polyester, alkyd resin, polyimide resin, polysulfone, poly(phenylene sulfide), or poly(ether sulfone).

The above ester resin may include, for example, an aromatic polyester, aliphatic polyester, or unsaturated polyester. The above aromatic polyester may include a copolymer of a diol, which will be described later, such as ethylene glycol, propylene glycol, or 1,4-butanediol and an aromatic dicarboxylic acid such as terephthalic acid. The above aliphatic polyester may include, for example, a copolymer of a diol which will be described later and an aliphatic dicarboxylic acid such as succinic acid or valeric acid, a homopolymer of a hydroxylcarboxylic acid such as glycolic acid or lactic acid or a copolymer thereof, or a copolymer of the aforementioned diol, the above aliphatic dicarboxylic acid and the above hydroxylcarboxylic acid. The above unsaturated polyester may include a copolymer of a diol which will be described later and an unsaturated dicarboxylic acid such as maleic anhydride, and whenever necessary, a vinyl monomer such as styrene may also be used.

The above U polymer may include a copolymer of bisphenol A or a derivative thereof, that is, a bisphenol derivative, and terephthalic acid, isophthalic acid or the like.

The above liquid crystal polymer is a copolymer of p-hydroxylbenzoic acid and terephthalic acid, p,p'-dioxydiphenol, p-hydroxy-6-naphtoic acid, polyterephthalic ethylene, or the like.

The above poly(ether ketone) may include a homopolymer of 4,4'-difluorobenzophenone, 4,4'-dihydrobenzophenone, or the like or a copolymer thereof.

The above poly(ether ether ketone) may include a copolymer of 4,4'-difluorobenzophenone and hydoquinone or the like.

The above alkyd resin may include a copolymer of a higher fatty acid such as stearic acid or paltimin acid, a dibasic acid such as phthalic anhydride, a polyol such as glycerin, and the like.

The above polysulfone may include a copolymer of 4,4'-dichlorodiphenyl sulfone, bisphenol A and the like.

The above poly(phenylene sulfide) may include a copolymer of p-dichlorobenzene, sodium sulfide, and the like.

The above poly(ether sulfone) may include a polymer of 4-chloro-4'-hydroxydiphenyl sulfone.

The above polyimide resin may include, for example, a pyromellitic acid type polyimide which is a copolymer of pyromellitic anhydride, 4,4'-diaminodiphenyl ether, and the like; a trimellitic acid type polyimide which is a copolymer of trimellitic anhydride chloride, an aromatic diamine such as p-phenylenediamine, a diisocyanate compound which will be described below, and the like; a biphenyl type polyimide composed of biphenyl tetracarboxylic acid, 4,4'-diaminodiphenyl ether, p-phenylenediamine, and the like; a benzophenone type polyimide composed of benzophenone tetracarboxylic acid, 4,4'-diaminodiphenyl ether, and the like; and a bismaleimide type polyimide composed of bismaleimide, 4,4'-diaminodiphenylmethane, and the like.

The above polyaddition resin may include, for example, a urethane resin.

The above urethane resin is a copolymer of a diisocyanate and a diol. The above diisocyanate may include, for example, dicyclohexyl methane diisocyanate, 1,6-hexamethylene diisocyanate, isophorone diisocyanate, 1,3-cyclohexyl diisocyanate, 1,4-cyclohexyl diisocyanate, 2,4-tolylene diisocyanate, 2,6-tolylene diisocyanate, 4,4'-diphenylmethane diisocyanate, 2,4'-diphenylmethane diisocyanate, or 2,2'-diphenylmethane diisocyanate. The above diol may include, for example, a diol having a relatively small molecular weight such as ethylene glycol, propylene glycol, 1,3-propanediol, 1,3-butanediol, 1,4-butanediol, 1,5-pentanediol, 3-methyl-1, 5-pentanediol, 1,6-hexanediol, neopentyl glycol, diethylene glycol, trimethylene glycol, triethylene glycol, tetraethylene glycol, dipropylene glycol, tripropylene glycol, or cyclohexanedimethanol; a polyester diol; a polyether diol; or polycarbonate diol.

The above addition condensation resin may include, for example, a phenol resin, urea resin, or melamine resin.

The above phenol resin may include a homopolymer of phenol, cresol, resorcinol, phenylphenol, bisphenol A, bisphenol F, or the like or a copolymer thereof.

The above urea resin and melamine resin are copolymers of formaldehyde, urea, melamine or the like.

The above ring-opening polymerization resin may include, for example, a poly(alkylene oxide), polyacetal, or epoxy resin. The above poly(alkylene oxide) may include a homopolymer of ethylene oxide, propylene oxide, or the like, or a copolymer thereof. The above polyacetal may include a copolymer of trioxane, formaldehyde, ethylene oxide, or the like. The above epoxy resin may include, for example, an aliphatic epoxy resin formed of a polyalcohol such as ethylene glycol and epichlorohydrine or an aliphatic epoxy resin formed of a bisphenol A and epichlorohydrine.

In the present invention, among the matrix materials mentioned above, an amorphous synthetic resin having a high glass transition temperature (Tg) is particularly preferable since a fiber-reinforced composite material having superior transparency and durability can be obtained, and in addition, as the degree of amorphousness, the degree of crystallinity is preferably 10% or less and more preferably 5% or less. In addition, the Tg is preferably 110° C. or more, more preferably 120° C. or more, and even more preferably 130° C. or more. When a matrix material having a Tg less than 110° C. is brought into contact with boiling water, for example, deformation occurs, and in applications of transparent components, optical components, and the like, the durability becomes a problem. By the way, the Tg may be measured in accordance with a DSC method, and the degree of crystallinity may be obtained by a density method in which the degree of crystallinity is calculated from the densities of an amorphous portion and a crystalline portion.

In the present invention, as preferable transparent matrix materials, for example, there may be mentioned thermosetting resins such as an acrylic resin, methacrylic resin, epoxy resin, urethane resin, phenol resin, melamine resin, novolac resin, urea resin, guanamine resin, alkyd resin, unsaturated polyester resin, vinyl ester resin, dially phthalate resin, silicone resin, furan resin, ketone resin, xylene resin, thermosetting polyimide, styrylpyridine-based resin and triazine-based resin. Among those mentioned above, an acrylic resin and a methacrylic resin, which have significantly superior transparency, are preferably used.

The matrix materials mentioned above may be used alone or in combination.

Next, a method for manufacturing the fiber-reinforced composite material of the present invention will be described.

For forming the fiber-reinforced composite material of the present invention, the fibers are impregnated with an impregnating liquid capable of forming the matrix material as described above, followed by curing of the impregnating liquid.

In this case, the impregnating liquid may be selected from at least one of a fluid matrix material, a fluid raw material of a matrix material, a fluid prepared by fluidizing a matrix material, a fluid prepared by fluidizing a raw material of a matrix material, a solution of a matrix material, and a solution of a raw material of a matrix material.

The fluid matrix material includes a matrix material having its own fluidity. In addition, as the fluid raw material of a matrix material, for example, a polymerization intermediate such as a prepolymer or an oligomer may be mentioned.

As the fluid prepared by fluidizing a matrix material, for example, there may be a fluid obtained by heating and melting a thermoplastic matrix material.

As the fluid prepared by fluidizing a raw material of a matrix material, for example, when a polymerization intermediate such as a prepolymer or an oligomer is in a solid state, a fluid may be mentioned which is obtained by heating and melting the intermediate.

As the solution of a matrix material and as the solution of a raw material of a matrix material, a solution may be mentioned in which the matrix material or the raw material thereof is dissolved in a solvent or the like. This solvent may be optionally determined in accordance with a matrix material and a raw material thereof to be used; however, there is preferably selected a solvent having a boiling point lower than a certain temperature so that when the solvent is removed in a subsequent step by evaporation, the matrix material or the raw material thereof may not be degraded.

An aggregate of fibers, which is preferably a single layered sheet of the above BC sheet or a multilayered sheet composed of a plurality of the above BC sheets, is immersed in the impregnating liquid as described above so that spaces between the fibers are sufficiently impregnated with the impregnating liquid. It is preferable that a part of this impregnation step or the entire thereof be performed in a state in which the pressure is changed. As the method for changing the pressure, evacuation of pressure or application of pressure may be mentioned by way of example. When evacuation of pressure or application of pressure is performed, air present between the fibers can be easily replaced with the impregnating liquid, and as a result, air voids are prevented from remaining.

As the condition for evacuation of pressure, a pressure of 0.133 kPa (1 mm Hg) to 93.3 kPa (700 mm Hg) is preferable. When the reduced-pressure condition is more than 93.3 kPa (700 mm Hg), air is not sufficiently removed and may be allowed to remain between the fibers in some cases. Although the reduced-pressure condition may be decreased to less than 0.133 kPa (1 mm Hg), an evacuation machine and the like tend to be excessively large.

A temperature in the impregnation step under the reduced-pressure condition is preferably 0° C. or more and more preferably 10° C. or more. When this temperature is less than 0° C., air is not sufficiently removed and may be allowed to remain between the fibers in some cases. When a solvent is used for the impregnating liquid, the upper limit of the temperature is preferably a boiling point (boiling point under the reduced-pressure condition) of the solvent. When the temperature is more than the boiling point, the solvent becomes vigorously evaporated, and adversely, air voids are liable to remain.

As the condition for pressure application, a pressure of 1.1 to 10 MPa is preferable. When the condition for pressure application is less than 1.1 MPa, air is not sufficiently removed and may be allowed to remain between the fibers in some cases. Although the condition for pressure application may be increased to more than 10 MPa, a pressure-application machine and the like tend to be excessively large.

A temperature in the impregnation step under the condition for pressure application is preferably 0 to 300° C. and more preferably 10 to 100° C. When this temperature is less than 0° C., air is not sufficiently removed and may be allowed to remain between the fibers in some cases. When the temperature is more than 300° C., the matrix material may be denatured in some cases.

In order to cure the impregnating liquid impregnated in the fibers, curing may be performed in accordance with a curing method for this impregnating liquid. For example, when the impregnating liquid is a fluid matrix material, curing can be performed by crosslinking reaction, elongation reaction or the like. When the impregnating liquid is a fluid raw material of a matrix material, curing can be performed by polymerization reaction, crosslinking reaction, elongation reaction or the like.

When the impregnating liquid is a fluid prepared by fluidizing a matrix material, curing can be performed by cooling or the like. When the impregnating liquid is a fluid prepared by fluidizing a raw material of a matrix material, curing can be performed by cooling or the like in combination with polymerization reaction, crosslinking reaction, elongation reaction or the like.

When the impregnating liquid is a solution of a matrix material, curing can be performed when a solvent in the solution is removed by evaporation, air drying or the like. When the impregnating liquid is a solution of a raw material of a matrix material, curing can be performed by removing a solvent or the like in the solution in combination with polymerization reaction, crosslinking reaction, elongation reaction or the like. In the above removal by evaporation, besides removal by evaporation under atmospheric pressure, removal by evaporation under reduced-pressure may also be included.

The fiber-reinforced composite material of the present invention thus obtained has a 50 μm-thick visible light transmittance of 60% or more, preferably 65% or more, more preferably 70% or more, even more preferably 80% or more, and most preferably 90% or more. When the 50 μm-thick visible light transmittance of the fiber-reinforced composite material is less than 60%, a semi-transparent or an opaque state is only obtained, and hence the objects of the present invention cannot be achieved. As a result, in some cases, it may become difficult to use the composite material of the present invention in various applications which require transparency, such as window materials of movable bodies including automobiles, electric trains, ships and the like, displays, housings, buildings and plants, and various optical components.

The fiber-reinforced composite material of the present invention preferably has a coefficient of linear thermal expansion of $0.05 \times 10^{-5}$ to $5 \times 10^{-5} K^{-1}$, more preferably $0.2 \times 10^{-5}$ to $2 \times 10^{-5} K^{-1}$, and even more preferably $0.3 \times 10^{-5}$ to $1 \times 10^{-5} K^{-1}$. Although the coefficient of linear thermal expansion of the fiber-reinforced composite material may be less than $0.05 \times 10^{-5} K^{-1}$; however, in consideration of the coefficient of linear thermal expansion of cellulose fibers and the like, it may be difficult in some cases to realize the above coefficient. On the other hand, when the coefficient of linear thermal expansion is more than $5 \times 10^{-5} K^{-1}$, the fiber-reinforcing effect cannot be obtained, and because of the difference in coefficient of linear thermal expansion from that of a glass or a metal material, depending on ambient temperature, flexure or strain may be generated in window materials, and image forming properties and refractive indexes of optical components may not work well as designed in some cases.

The fiber-reinforced composite material of the present invention preferably has a flexural strength of 30 MPa or more and more preferably 100 MPa or more. When the flexural strength is less than 30 MPa, a sufficient strength cannot be obtained, and as a result, the use of this composite material in applications of structural materials and the like to which forces are applied may be adversely influenced in some cases. The upper limit of the flexural strength is generally approximately 600 MPa; however, by improvement, such as adjustment of fiber orientation, a higher flexural strength, such as 1 GPa or approximately 1.5 GPa, can also be expected.

The fiber-reinforced composite material of the present invention preferably has a flexural modulus of 0.1 to 100 GPa and more preferably 1 to 40 GPa. When the flexural modulus is less than 0.1 GPa, a sufficient strength cannot be obtained, and as a result, the use of this composite material in applications of structural materials and the like to which forces are applied may be adversely influenced in some cases. It is difficult to realize a flexural modulus of more than 100 GPa.

The specific gravity of the fiber-reinforced composite material of the present invention is preferably 1.0 to 2.5. In particular, as the matrix material, when an organic polymer is used other than an inorganic polymer such as a titanate compound, alumina, a silicate compound such as a glass, or the like, or when a porous material is used even though being an inorganic polymer, the specific gravity of the fiber-reinforced composite material of the present invention is preferably 1.0 to 1.8, more preferably 1.2 to 1.5, and even more preferably 1.3 to 1.4. The specific gravity of matrix materials other than a glass is generally less than 1.6, and in addition, the specific gravity of cellulose fibers is approximately 1.5; hence, when it is attempted to decrease the specific gravity to less than 1.0, the content of cellulose fibers and the like is decreased, and improvement in strength by cellulose fibers and the like tends to be insufficient. On the other hand, when the specific gravity is more than 1.8, the weight of a fiber-reinforced composite material to be obtained becomes large, and compared to a glass fiber-reinforced material, the use of the composite material of the present invention may be disadvantageous in applications in which reduction in weight is attempted.

When an inorganic polymer (other than porous materials) such as a silicate compound including a glass, a titanate compound, or alumina is used, the specific gravity of the fiber-reinforced composite material of the present invention is preferably 1.5 to 2.5 and more preferably 1.8 to 2.2. Since the specific gravity of a glass is generally 2.5 or more, and the specific gravity of cellulose fibers is approximately 1.5, when it is attempted to increase the specific gravity to 2.5 or more, the content of cellulose fibers and the like is decreased, and as a result, improvement in strength by cellulose fibers and the like tends to be insufficient. On the other hand, when the specific gravity is less than 1.5, the spaces between fibers may not be sufficiently filled in some cases.

In the present invention, the coefficient of linear thermal expansion is a coefficient of linear thermal expansion obtained when the fiber-reinforced composite material is heated from 50° C. to 150° C. and is measured under the conditions in accordance with ASTM D 696. The flexural strength is a value measured in accordance with JIS K 7203. The specific gravity of the fiber-reinforced composite material can be obtained by the steps of measuring the mass per unit volume at 20° C. to obtain the density and then converting it based on the density (1.004 g/cm$^3$ (20° C.)) of water.

Since having superior transparency and further having various superior functionalities owing to composition between the fibers and the matrix material, the fiber-reinforced composite material of the present invention can be suitably used for various applications in an optical field, structural material field, building material field, and the like.

[2] Transparent Multilayered Sheet

A transparent multilayered sheet of the present invention is composed of a base material made of the fiber-reinforced composite material of the present invention and a transparent conductive film provided on a surface thereof.

The transparent conductive film of the present invention is patterned to function as transparent conductive wires used, for example, for a liquid crystal element, electronic paper, or a touch panel. In addition, in an organic El element, the transparent conductive film functions as a transparent conductive wire and an anode of an electroluminescence element.

As the transparent conductive film, a composite oxide thin film, such as indium oxide containing tin (commonly called "ITO"), zinc oxide containing aluminum (commonly called "AZO"), or zinc oxide containing indium (commonly called "IZO") is preferably used. Among those mentioned above, when ITO is processed by heat treatment at 150° C. or more, in general, crystallization proceeds, and as a result, electrical resistance is decreased. Hence, when ITO is used, a base material having a high Tg, which can withstand heat treatment as described above, is suitably used. Since having a high degree of amorphousness and a low electrical resistance even at around room temperature, IZO is suitably used also for a resin base material having a low Tg.

The transparent conductive film is formed by a vacuum film forming process such as deposition or sputtering. The transparent conductive film can also be formed by a coating method. For example, when a coating liquid is prepared by dispersing particles of ITO or ATO in a conductive binder or the like and is then applied to the base material made of the fiber-reinforced composite material, followed by heat treatment, the transparent conductive film can be formed.

A higher light transmittance in the visible light wavelength region of the transparent conductive film thus formed is more preferable, and for example, it is 50 to 99%. A preferable lower limit of the light transmittance is 60%, and 70% is more preferable.

A smaller electrical resistance of the transparent conductive film, that is, a smaller surface resistance of a transparent conductive wire, is more preferable; however, the resistance is generally 1 to 100 Ω/□, and the upper limit is preferably 70 Ω/□ and more preferably 50 Ω/□. The Ω/□ is a unit representing a surface resistance per 1 cm$^2$. However, a transparent conductive wire for a touch panel application is not in the range described above, because of requirement of position detection accuracy, the surface resistance is generally approximately 200 to 600 Ω/□ and is preferably approximately 300 to 500 Ω/□.

The thickness of the transparent conductive film is generally 0.01 to 10 μm as long as the light transmittance and the surface resistance described above are satisfied, and in view of the conductivity, the lower limit is preferably 0.03 μm (30 nm) and more preferably 0.05 μm (50 nm). In view of the light transmittance, the upper limit is preferably 1 μm and more preferably 0.5 μm.

This transparent conductive film is generally formed on one surface of the base material made of the fiber-reinforced composite material; however, depending on application, the transparent conductive films may be formed on two surfaces of the base material. After the transparent conductive film is pattern-etched, whenever necessary, by a photolithographic method or the like to form a circuit, a switch, an electrode, or the like having a desired shape, the transparent multilayered sheet of the present invention, that is composed of the transparent conductive film formed on the base material made of the fiber-reinforced composite material, is to be used.

Regardless of the thickness of the base material made of the fiber-reinforced composite material and the thickness of the transparent conductive film, when being irradiated with light having a wavelength of 400 to 700 nm in the thickness direction, the transparent multilayered sheet of the present invention having the transparent conductive film as described above preferably has an average light transmittance of 60% or more in the entire wavelength region, more preferably 70% or more, and even more preferably 80% or more.

[3] Circuit Board

A circuit board of the present invention is manufactured by forming a wiring circuit using an ordinary method on a transparent substrate manufactured from the fiber-reinforced composite material of the present invention.

The wiring circuit can be formed, for example, by pressure bonding a foil made of a metal such as copper, silver, gold, aluminum, magnesium, tantalum or an alloy thereof to the transparent substrate, or by forming a film using the above metal or alloy by deposition, sputtering, or the like, followed by etching treatment using an ordinary method to form a predetermined circuit shape.

The circuit board of the present invention may be a multilayer circuit board in which transparent substrates having wiring circuits are laminated to each other, and in addition, at least one through hole may be formed in the transparent substrate in order to achieve electrical connection between the front surface and the back surface of the transparent substrate.

The transparent substrate of the circuit board of the present invention is formed of a highly transparent material having a 50 μm-thick visible light transmittance of 60% or more, preferably 65% or more, more preferably 70% or more, even more preferably 80% or more, and most preferably 90% or more. Furthermore, since having a low coefficient of thermal expansion, a high strength, and a high modulus, this fiber-reinforced composite material has the following features.

(1) Because of transparency, trimming of a built-in passive element can be performed.

Since a conventional substrate is opaque, it is impossible to perform fine adjustment (trimming) of a capacitance of a built-in passive element from the outside. Hence, after being once formed, the products must be discriminated into good and defective ones. On the other hand, since the transparent substrate made of the fiber-reinforced composite material of the present invention is transparent, the position of a built-in passive element can be recognized from the outside, and trimming can be further performed from the outside using laser or the like. Hence, after the formation, fine adjustment can be performed in accordance with properties, and as a result, the yield can be improved.

(2) Because of a low coefficient of linear thermal expansion (such as $7 \times 10^{-6} K^{-1}$), the transparent substrate is suitably used as a package substrate on which chips are directly mounted.

A conventional common substrate which is composed of a resin in combination with at least one glass clothe has a coefficient of linear thermal expansion of approximately $15 \times 10^{-6}$ to $20 \times 10^{-6} K^{-1}$. In addition, when a semiconductor chip (silicon), which has a coefficient of linear thermal expansion of $3 \times 10^{-6}$ to $4 \times 10^{-6} K^{-1}$, is directly mounted, in order to reduce a thermal stress due to the difference in coefficient of linear thermal expansion, an underfill agent is filled. On the other hand, the transparent substrate made of the fiber-reinforced composite material of the present invention has a low linear thermal expansion property, approximately 1/60 of a coefficient of linear thermal expansion of a glass, which is close to that of a chip, and hence a problem caused by a thermal stress due to the difference in thermal expansion from that of the chip may not arise at all.

(3) Since having a high strength (such as a flexural strength of approximately 460 MPa) and a high modulus (such as a flexural modulus of approximately 30 GPa which is approximately 2 times that of a glass), the transparent substrate is suitably used as a thin package substrate.

When the thickness of a conventional substrate is decreased to form a thin type substrate, the rigidity becomes insufficient, and in the case of a one-side molded package, warping is increased, so that problems of the reliability and the like may arise. However, since the modulus of the transparent substrate made of the fiber-reinforced composite material of the present invention is significantly high as compared to that of a glass, even a thin substrate has a high rigidity, and in the case of a one-side molded package, warping can be significantly decreased.

Accordingly, it is expected that the circuit board of the present invention be applied to a semiconductor mounting circuit board, particularly, to a flipchip package that will be required from now on and a technical field of built-in passive elements.

[4] Optical Waveguide

An optical wavelength of the present invention is formed of the transparent substrate made of the fiber-reinforced composite material of the present invention and a core which is preferably provided directly thereon, and whenever necessary, a clad covering this core may also be formed.

Hereinafter, the optical wavelength of the present invention will be described in detail with reference to figures.

FIGS. 14a to 14e are cross-sectional views (perpendicular to the direction in which light travels) showing embodiments of optical waveguides of the present invention.

Figure 14A:
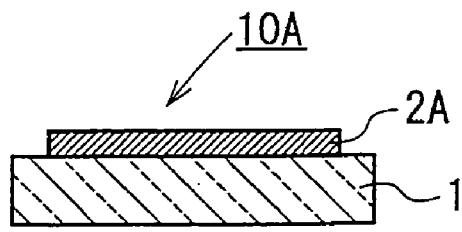
FIGS. 14a to 14e are cross-sectional views each showing an embodiment of an optical waveguide of the present invention.
Figure 14B:
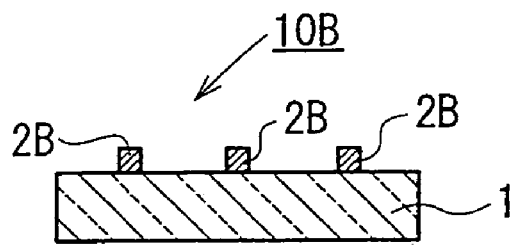
Figure 14C:
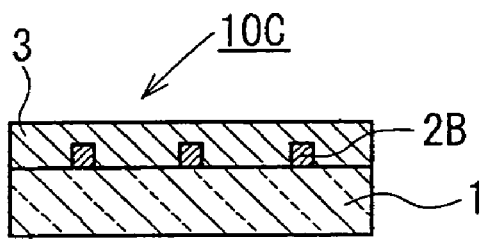
Figure 14D:
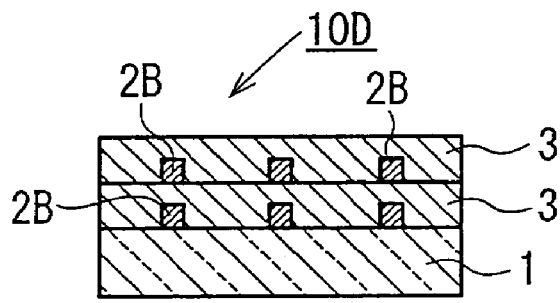
Figure 14E:
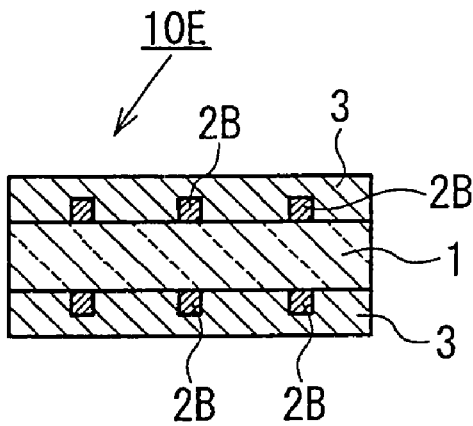

The structure of the optical waveguide of the present invention is not particularly limited, and for example, there may be mentioned a slab type optical waveguide 10A as shown in FIG. 14a in which a slab type core 2A is provided on a transparent substrate 1 of the fiber-reinforced composite material of the present invention; a ridge (rib) type optical waveguide 10B as shown in FIG. 14b in which ridge (rib) cores 2B are provided on the transparent substrate 1 of the fiber-reinforced composite material of the present invention; and a built-in type optical waveguide 2C as shown in FIG. 14c in which a clad 3 is further provided for the ridge type optical waveguide as described above so as to cover the cores 2B. In addition, there can also be formed an optical waveguide 10D having a one-side laminated structure as shown in FIG. 14d in which two layers each containing the cores 2B and the clad 3 are laminated on one surface of the transparent substrate 1 and an optical waveguide 10E having a two-side (front and back surfaces) laminated structure as shown in FIG. 14e in which the cores 2B and the clads 3d are laminated on two surfaces of the transparent substrate 1.

Figure 15A:
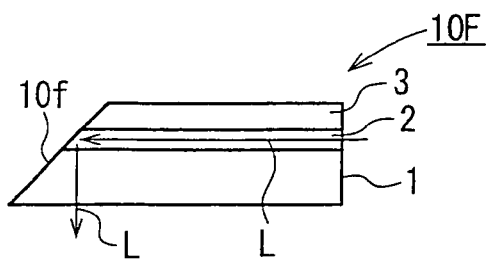
FIGS. 15a to 15g are views each showing an example of a light reflection structure of an optical waveguide of the present invention.
Figure 15B:
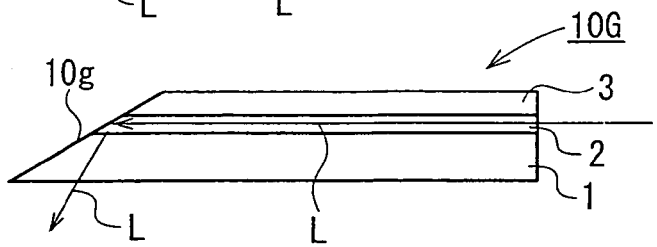
Figure 15C:
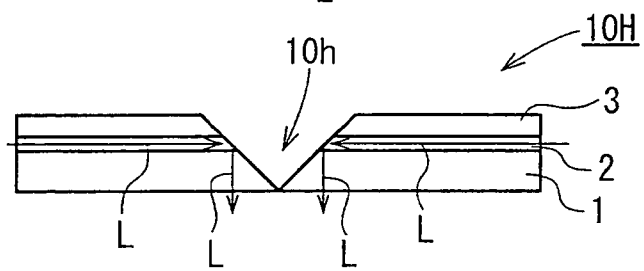
Figure 15D:
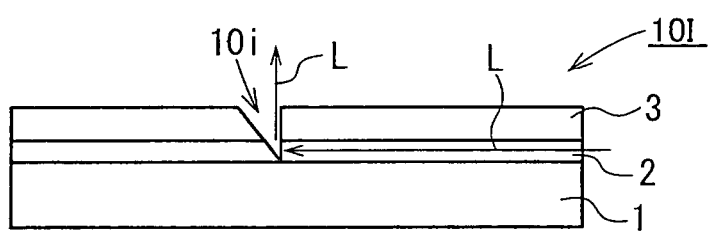
Figure 15E:
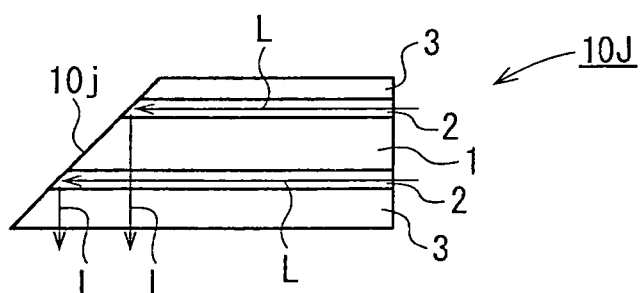
Figure 15F:
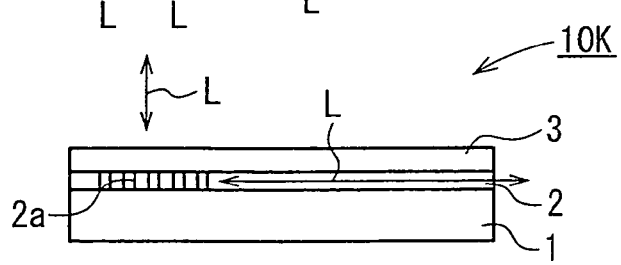
Figure 15G:
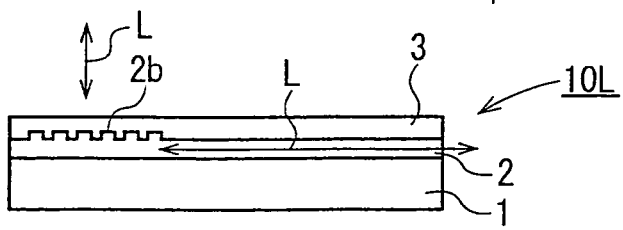

For incoming and outgoing light, whenever necessary, the optical waveguide as described above is processed by cutting as shown in FIGS. 15a to 15e, or grating is formed in the optical waveguide as shown in FIGS. 15f and 15g, and subsequently, the optical waveguide is mounted for the use. In FIGS. 15a to 15f, reference numeral 1 indicates the transparent substrate, reference numeral 2 indicates the core, reference numeral 3 indicates the clad, and L indicates an optical signal. FIGS. 15a to 15e each show a cross-sectional view of the optical waveguide along the direction in which light travels, and in the figures, in order to show the traveling direction of the optical signal, hatching indicating a cross-section is omitted.

An optical waveguide 10F shown in FIG. 15a has an inclined surface 10f having an angle of 45° at the front end along the light traveling direction, so that the light traveling direction is reflected by 90° to the transparent substrate 1 side (rear surface side). An optical waveguide 10G shown in FIG. 15b has an inclined surface 10g similar to that described above (however, the inclined angle is θ°), so that the light traveling direction is reflected by (180-2θ)° to the transparent substrate 1 side. An optical waveguide 10H shown in FIG. 15c has a V-shaped groove 10h formed in the central portion thereof, so that light rays incident from two directions are reflected to the transparent substrate 1 side. An optical waveguide 10I shown in FIG. 15d has a V-shaped groove 10i formed so that one interior wall surface thereof is perpendicular to the plate surface of the transparent substrate 1, so that light is reflected to a reflection side (front surface side) to the transparent substrate 1. An optical waveguide 10J shown in FIG. 15e is the above optical waveguide 10E having a two-side laminated structure provided with an inclined surface 10j having an angle of 45°, so that two light rays are reflected by 90°. In an optical waveguide 10K shown in FIG. 15f, a grating portion 2a is formed in the core 2a (or a clad portion in the vicinity thereof) so that the refractive index is periodically changed, and in addition, in an optical waveguide 10L shown in FIG. 15g, a periodical concave-convex grating portion 2b is formed on the surface of the core 2. In the optical waveguides 10K and 10L, when the effective refractive index of the core 2 is represented by N, the refractive index of a medium at a side to which light is emitted is represented by n, the wave number of propagating light in the core 2 is represented by k, the period of the grating is represented by Λ, and q is an integer (0, ±1, ±2, ±3, . . . ), and when an integer q that satisfies the following equation is present, $$|Nk+q(2\pi/\Lambda)|<nk$$ [Equation 1]

incoming light and outgoing light travel along an angle θ represented by the following equation.

$$\sin\theta=\{Nk+q(2\pi/\Lambda)\}/nk$$ [Equation 2]

Since being formed of the transparent substrate made of the fiber-reinforced composite material of the present invention, when the optical waveguide of the present invention as described above is mounted, the following superior effects can be obtained because of the low linear thermal expansion properties (coefficient of linear thermal expansion of 0.05× $10^{-5}$ to 5×$10^{-5}K^{-1}$) and the high light transmission properties (50 μm-thick visible light transmittance of 60% or more).

Because of superior light transmission properties of the transparent substrate, when light inside the core 2 is transmitted through the transparent substrate 1 and emitted therefrom, or inversely, when light transmitted through the transparent substrate 1 is allowed to enter the core 2 by the above methods described with reference to FIGS. 15a to 15c, 15e and the like, light can be transmitted in the transparent substrate 1 with a high light transmittance, and hence, decrease in amount of light caused by transmission of light through the transparent substrate 1 can be reduced.

Figure 16A:
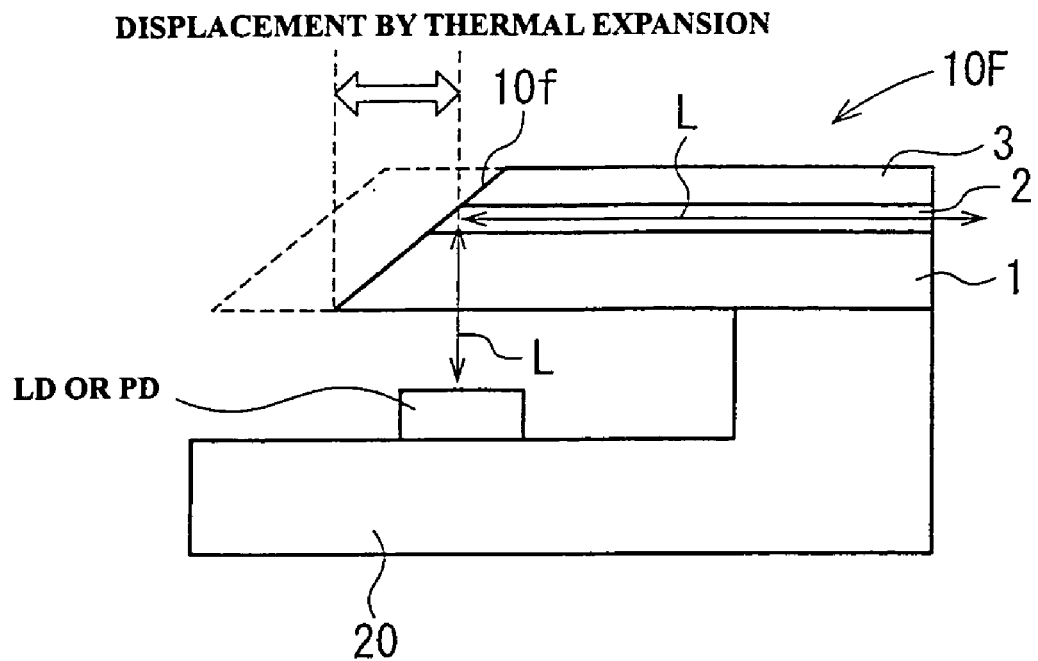
FIGS. 16a and 16b are views each illustrating an embodiment in which an optical waveguide of the present invention is mounted.

Because of the low thermal expansion properties of the transparent substrate, the thermal expansion of the transparent substrate in the surface direction can be reduced, and as described below, the displacement of a light coupling position is prevented which is caused by the change in temperature, so that it becomes possible that light signals can be reliably sent and received. When the above taper type optical waveguide 10F having the inclined surface 10f as shown in FIG. 15a is mounted on a mounting substrate 20 provided with a LD (Laser Diode) module functioning as a signal sending portion and a PD (Photo Diode) module functioning as a signal receiving portion as shown in FIG. 16a so as to send and receive light, and when the substrate 1 of the optical waveguide 10F expands in the surface direction due to thermal expansion thereof by change in temperature and is located at a position shown by a dotted line in FIG. 16a, light passing through the core 2 and being reflected at the inclined surface 10f is not incident on the position at which the PD is provided, and in addition, light emitted from the LD is reflected at the inclined surface 10f and is not incident on the core 2.

Figure 16B:
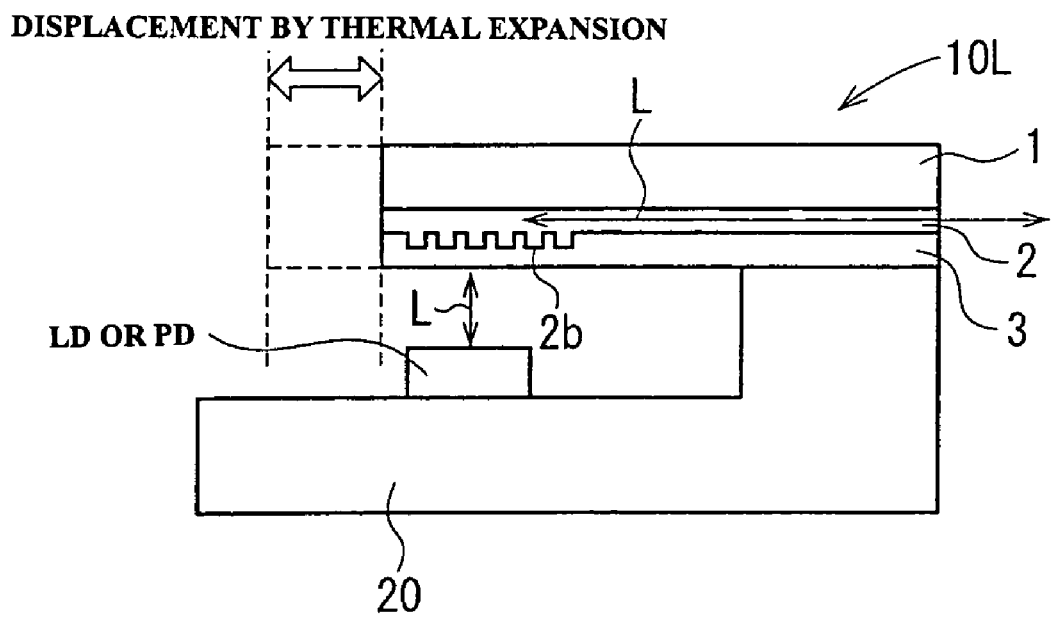

In the same manner as described above, when the above grating type optical waveguide 10L having the periodical concave-convex portion 2b on the surface of the core 2 as shown in FIG. 15g is mounted on the mounting substrate 20 provided with the LD (Laser Diode) module functioning as a signal sending portion and the PD (Photo Diode) module functioning as a signal receiving portion as shown in FIG. 16b so as to send and receive light, and when the substrate 1 of the optical waveguide 10L expands in the surface direction due to thermal expansion thereof by change in temperature and is located at a position shown by a dotted line in FIG. 16b, light passing through the core 2 and being emitted from the concave-convex portion 2b is not incident on the position at which the PD is provided, and in addition, light emitted from the LD is reflected at the concave-convex portion 2b and is not incident on the core 2.

The displacement caused by the thermal expansion of the transparent substrate of the optical waveguide as described above has not occurred at all as long as a substrate made of silicon, a substrate made of quartz, or the like is used. However, a substrate made of plastic that has a low thermal expansion has not been provided, and by this reason, although having various advantages such as light weight, inexpensive, superior impact resistance and superior processability, the substrate made of plastic has not been practically used as the transparent substrate of the optical waveguide.

On the other hand, according to the present invention, by using the fiber-reinforced composite material of the present invention as a material of the transparent substrate of the optical waveguide, even when a resin-based material is used for the transparent substrate, an optical waveguide can be provided in which a problem of displacement of a light coupling position may not arise when the optical waveguide is mounted.

EXAMPLES

Hereinafter, with reference to manufacturing examples, an analysis example, examples and comparative examples, the present invention will be described in detail; however, as long as being within the scope of the present invention, the present invention is not limited to the following examples. Evaluation methods and measurement methods of various properties of the fiber-reinforced composite material and others materials are described below.

[Specific Gravity]

The mass of a sample per unit volume was measured at 20° C. to obtain the density, and then the specific gravity was calculated based on the density (1.004 g/cm³ (20° C.)) of water.

[50 µm-Thick Visible Light Transmittance]
<Measurement Apparatus>
"UV-4100 spectrophotometer" (solid sample measurement system) manufactured by Hitachi High-Technologies Corp. was used.
A light source mask having a size of 6 mm by 6 mm was used.
A test sample was placed at a position 22 cm apart from an opening of an integrating sphere, and photometry was performed. Since the sample is placed at the above position, diffuse transmission light is removed, and only linear transmission light directly reaches a light-receiving portion inside the integrating sphere.
A reference sample was not used. Since the reference (reflection caused by the difference in refractive index between the sample and air. When the Fresnel reflection occurs, a linear transmittance of 100% cannot be obtained.) was not present, a loss in transmittance caused by the Fresnel reflection occurred.
Scanning speed: 300 nm/min
Light source: tungsten lamp, heavy hydrogen lamp
Light source switching: 340 nm

[Photo-Taking of Scanning Electron Microscopic Photograph (SEM Photograph) Image]
<Method for Forming Sample>
Bacterial cellulose: Hydrated bacterial cellulose was frozen by liquid nitrogen, followed by vacuum drying.
Disaggregated bacterial cellulose: From a grinder-treated suspension formed in manufacturing example 2, a suspension at a concentration of 0.02 percent by weight was formed and was then frozen by liquid nitrogen, followed by vacuum drying.
<Preparation of Sample and Measurement Conditions>
Gold deposition (deposition thickness: several nanometers) was performed for samples thus freeze-dried, and observation using an electron microscope was performed under the following conditions.
Measurement apparatus: JEOL 5310 (manufactured by JEOL Ltd.)
Accelerating voltage: 10 kV
Magnification: 2,000 times
Working distance: 20 mm
Adjustment of contrast: AUTO

[Measurement of Coefficient of Linear Thermal Expansion]
By using "TMA/SS6100" manufactured by Seiko Instrument Inc., measurement was performed by a method in accordance with ASTM D 696 under the following conditions.
<Measurement Conditions>
Temperature rising rate: 5° C./min
Atmosphere: $N_2$ atmosphere
Heating temperature: 50 to 150° C.
Load: 3 g
Times of measurement: 3 times
Length of sample: 4×15 mm
Thickness of sample: various thicknesses depending on samples
Mode: Tensile mode

[Flexural Strength]
A sample having a width of 8 mm and a length of 5 mm was formed from a material having a thickness of approximately 1 mm, and measurement was performed by a 3-point bending using a method in accordance with JIS K 7203.

[Flexural Modulus]
A sample having a width of 8 mm and a length of 5 mm was formed from a material having a thickness of approximately 1 mm, and measurement was performed by a method in accordance with JIS K 7203 at a deformation rate of 5 mm/min.

[Air Permeance]
Measurement was performed for a BC sheet sample having a bulk density of 1.2 $g/m^3$ and a thickness of 40 µm by a method in accordance with JIS P 8117.

[Specific Resistance]
As a measurement apparatus, Loresta manufactured by Mitsubishi Chemical Corp. was used, and 4 point probe "AS probe MCT-TP03" was used. The resistivity was measured by a four point probe method (JIS R 1637) and was then converted to the specific resistance.

[$\geq$4.5 µm RL Ratio]
Image analysis was performed by the following procedure.
1. Original image: From an image at a magnification of 2,000 times obtained by using a scanning electron microscope, a region having a longitudinal dimension of 65 µm and a lateral dimension of 51 µm was converted into a digital image, and a digital image composed of 512 pixels in the longitudinal direction and 400 pixels in the lateral direction was formed, each pixel having a brightness level of 1 byte (256 gradations). The surface imagery of the image thus obtained was approximately 0.128 µm/pixel.
2. Formation of run-length image: By using Image-Pro Plus ver. 4.0 (Media Cybernetics Inc. (US)), the product (AND) operation for each pixel was performed between a binary image obtained by automatic binarization (threshold value being determined by automatic extraction) of the original image and an image (hereinafter referred to as a "stripe image") in which white and black lines are provided for individual pixels in the lateral direction (or in the longitudinal direction perpendicular to this lateral direction), so that a lateral (or longitudinal) run-length image was formed.
3. Statistic analysis of run-length: A histogram of run-lengths (in the original image, lengths of segments formed by cutting continuously bright regions which correspond to pore regions of a fiber aggregate) in the lateral (or longitudinal) direction was obtained so as to use an index representing "fineness of image". In particular, a measured area (number of pixels) was multiplied by a calibration value using Excel for conversion to obtain the length (µm), so that the average value was output. Furthermore, a histogram was calculated from the number histogram by weighting the length.

Manufacturing Example 1

Manufacturing of BC Sheet

After a culture fluid was added to a strain of acetic acid bacteria stored in a freeze-dried state, stationary culture was performed for 1 week (25 to 30° C.). On the surface of the culture fluid, bacterial cellulose was produced, and after a relatively thick part of the bacterial cellulose thus produced was selected, a small amount of a culture fluid of that strain was sampled and then added to a new culture fluid. Subsequently, this culture fluid was placed in a large incubator, followed by stationary culture for 7 to 30 days at 25 to 30° C. As the culture fluid, an aqueous solution (SH culture medium) having a pH of 5.0 adjusted by hydrochloric acid was used, containing 2 percent by weight of glucose, 0.5 percent by weight of bactoyeast extract, 0.5 percent by weight of bactopeptone, 0.27 percent by weight of disodium hydrogen-phosphate, 0.115 percent by weight of citric acid, and 0.1 percent by weight of magnesium sulfate heptahydrate.

The bacterial cellulose thus produced was recovered from the culture fluid and was then boiled in an alkaline aqueous solution at a concentration of 2 percent by weight for 2 hours. Subsequently, after the bacterial cellulose was recovered from the alkaline aqueous solution, washing was performed sufficiently to remove the alkaline aqueous solution, so that bacteria in the bacterial cellulose were removed by dissolution. Next, the hydrated bacterial cellulose thus obtained (bacterial cellulose containing 95 to 99 percent by weight of water) was hot-pressed at 120° C. for 3 minutes under a pressure of 2 MPa, so that a BC sheet (content of water of 0 percent by weight) having a thickness of approximately 50 µm was obtained. The properties and the like of this BC sheet are shown in Table 1 below. In addition, as for the air permeance, the value was obtained by measurement using a BC sheet having a thickness of 40 µm formed in a manner similar to that described above.

TABLE 1

| BC Sheet | |
| --- | --- |
| Air permeance | 20109 sec/100 cc |
| Bulk density | 1.2 mg/mm³ |
| Content of fibers | about 70% |
| Porosity | about 30% |

When a scanning electron microscopic photograph (SEM photograph) of the bacterial cellulose used for air permeance measurement was taken and then processed by image analysis, as shown in FIG. 1, in the region having a longitudinal dimension of 51 µm and a lateral dimension of 65 µm, the presence of a three-dimensional intersection bacterial cellulose structural body was confirmed in which a fine network structure was formed from bacterial cellulose having an average fiber diameter of 50 nm.

Manufacturing Example 2

Manufacturing of Disaggregated BC Sheet

After being formed in manufacturing example 1, the bacterial cellulose was disaggregated using a household mixer to smaller pieces so as to be processed by grinding treatment. Subsequently, this bacterial cellulose aqueous suspension (concentration of 1 percent by weight) was repeatedly processed 30 times by grinding treatment at a disc revolution speed of 1,200 rpm. Next, the suspension thus processed by grinding treatment was filtrated using a glass filter, and a cake was hot-pressed at 120° C. under a compression pressure of 2 MPa so that water was totally removed, thereby obtaining a BC sheet having a bulk density of 1.2 kg/m³ and a thickness of 40 µm. When the air permeance of this disaggregated BC sheet was measured, it was 4,650 sec/100 cc.

Figure 2:
FIG. 2 is a scanning electron microscopic photograph (SEM photograph) of disaggregated bacterial cellulose obtained in manufacturing example 2.

In addition, when a scanning electron microscopic photograph (SEM photograph) of this disaggregated bacterial cellulose was taken and was then processed by image analysis, as shown in FIG. 2, in the region having a longitudinal dimension of 51 µm and a lateral dimension of 65 µm, a network structure formed from the bacterial cellulose was loose, and the average fiber diameter of the fibers was also large, such as 2 to 3 µm.

Analysis Example 1

In accordance with the image analysis method for evaluation of the ≧4.5 µm RL ratio, the ≧4.5 µm RL ratios in the longitudinal and the lateral directions were measured for the bacterial cellulose obtained in manufacturing example 1 and the disaggregated bacterial cellulose obtained in manufacturing example 2.

Figure 3A:
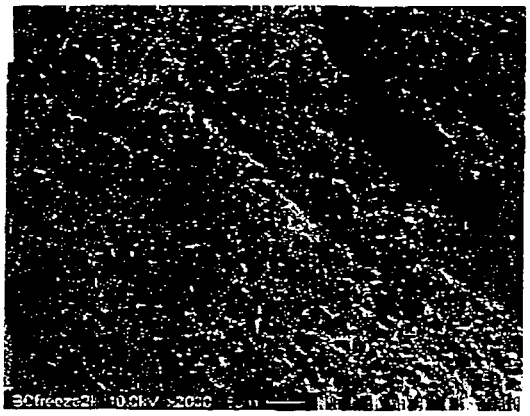
FIG. 3a is an original image of bacterial cellulose.
Figure 3B:
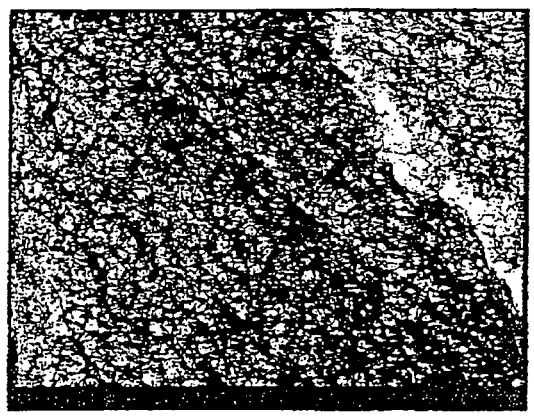
FIG. 3b is a binary image of the bacterial cellulose.

FIG. 3a shows an original image of the bacterial cellulose, FIG. 3b shows a binary image of the bacterial cellulose. This binary image was overlapped with a stripe image in FIG. 3c, so that a run-length image shown in FIG. 3d was obtained.

Figure 3D:
FIG. 3d is a run-length image of the bacterial cellulose.
Figure 4A:
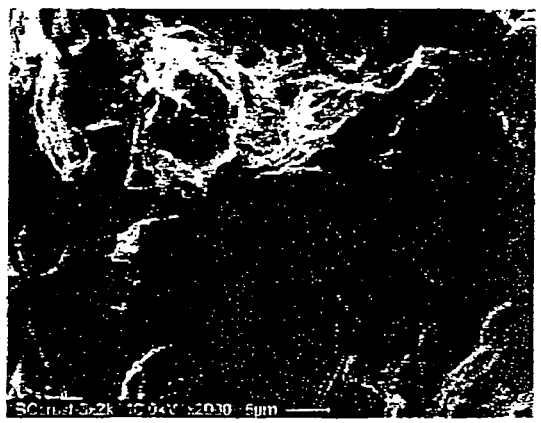
FIG. 4a is an original image of disaggregated bacterial cellulose.
Figure 4B:
FIG. 4b is a binary image of the disaggregated bacterial cellulose.

FIG. 4a shows an original image of the disaggregated bacterial cellulose, FIG. 4b shows a binary image of the disaggregated bacterial cellulose. This binary image was overlapped with a stripe image in FIG. 4c, so that a run-length image shown in FIG. 3d was obtained.

Figure 3C:
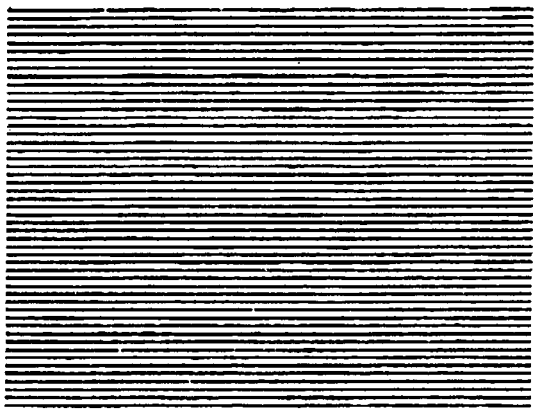
FIG. 3c is a stripe image which is to be overlapped with FIG. 3b.
Figure 4C:
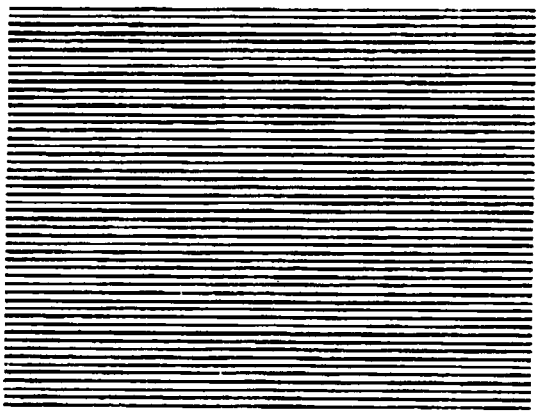
FIG. 4c is a stripe image which is to be overlapped with FIG. 4b.

In the stripe images shown in FIGS. 3c and 4c, for the convenience of illustration in the figure, the line width was shown larger than the actual one.

Figure 4D:
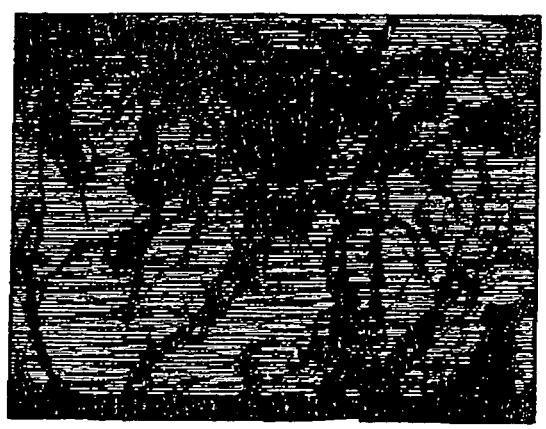
FIG. 4d is a run-length image of the disaggregated bacterial cellulose.
Figure 5A:
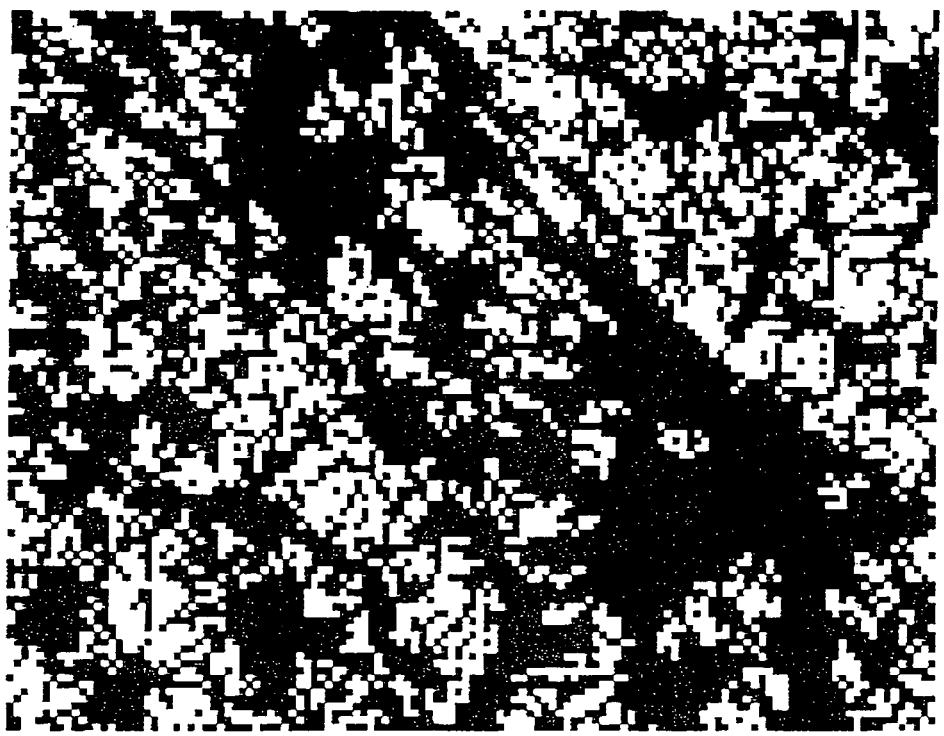
FIG. 5a is an enlarged view of FIG. 3b (binary image of the bacterial cellulose)
Figure 5B:
FIG. 5b is an enlarged view of FIG. 3d (run-length image of the bacterial cellulose).
Figure 6A:
FIG. 6a is an enlarged view of FIG. 4b (binary image of the disaggregated bacterial cellulose)
Figure 6B:
FIG. 6b is an enlarged view of FIG. 4d (run-length image of the disaggregated bacterial cellulose).

FIG. 5a is an enlarged view of FIG. 3b (binary image of the bacterial cellulose), and FIG. 5b is an enlarged view of FIG. 3d (run-length image of the bacterial cellulose). FIG. 6a is an enlarged view of FIG. 4b (binary image of the disaggregated bacterial cellulose), and FIG. 6b is an enlarged view of FIG. 4d (run-length image of the disaggregated bacterial cellulose).

Length histograms (accumulated ratio of the total analyzed length) obtained from the image analysis as described above are shown in Table 2 and FIG. 7.

TABLE 2

| | Lateral direction | | Longitudinal direction | |
| --- | --- | --- | --- | --- |
| Data zone (µm) * | Bacterial cellulose | Disaggregated bacterial cellulose | Bacterial cellulose | Disaggregated bacterial cellulose |
| 0-0.5 | 45.7% | 7.6% | 44.9% | 7.1% |
| 0.5-1.0 | 80.9% | 18.5% | 79.3% | 17.7% |
| 1.0-1.5 | 91.6% | 28.2% | 90.3% | 25.9% |
| 1.5-2.0 | 95.9% | 36.7% | 94.2% | 33.2% |
| 2.0-2.5 | 97.5% | 44.4% | 95.9% | 40.5% |
| 2.5-3.0 | 98.6% | 49.7% | 96.8% | 46.0% |
| 3.0-3.5 | 99.4% | 54.4% | 98.1% | 51.6% |
| 3.5-4.0 | 99.7% | 58.9% | 98.8% | 56.6% |
| 4.0-4.5 | 99.8% | 64.2% | 99.0% | 60.5% |
| 4.5-5.0 | 100.0% | 68.2% | 99.2% | 63.6% |
| 5.0-5.5 | 100.0% | 71.6% | 99.8% | 67.2% |
| 5.5-6.0 | 100.0% | 73.6% | 100.0% | 70.4% |
| 6.0-6.5 | 100.0% | 77.0% | 100.0% | 72.9% |
| 6.5-7.0 | 100.0% | 78.8% | 100.0% | 74.8% |
| 7.0-7.5 | 100.0% | 81.4% | 100.0% | 77.2% |
| 7.5-8.0 | 100.0% | 82.8% | 100.0% | 78.3% |
| 8.0-8.5 | 100.0% | 83.8% | 100.0% | 80.5% |
| 8.5-9.0 | 100.0% | 85.5% | 100.0% | 82.5% |
| 9.0-9.5 | 100.0% | 86.9% | 100.0% | 84.6% |
| 9.5-10.0 | 100.0% | 88.3% | 100.0% | 85.9% |

* each zone being in the range of from more than a value at the left side to a value or less at the right side From the results thus obtained, it was confirmed that although the ≧4.5 µm RL ratios of the bacterial cellulose obtained in manufacturing example 1 are 0.2% in the lateral direction and 1% in the longitudinal direction, the ≧4.5 µm RL ratios of the disaggregated bacterial cellulose obtained in manufacturing example 2 are 35.8% in the lateral direction and 39.5% in the longitudinal direction.

Manufacturing Example 3

Manufacturing of MFC Sheet

Microfibrillated cellulose: After MFC (obtained by microfibrillation of nadelholz bleached kraft pulp (NBKP) using a high pressure homogenizer, having an average fiber diameter of 1 μm) was sufficiently stirred with water to prepare 7 kg of an aqueous suspension at a concentration of 1 percent by weight, this aqueous suspension was allowed to repeatedly pass between two rotating discs of a grinder (manufactured under the trade name "Pure Fine Mili KMG1-10" by Kurita Machinery Mfg. Co., Ltd.) from the center to the outside 30 times (30 passes), the two discs being almost in contact with each other and at the disc revolution speed of 120 rpm.

From Nano MFC (average fiber diameter of 60 nm) obtained by the grinding treatment, an aqueous suspension at a concentration of 0.2 percent by weight was prepared, followed by filtration using a glass filter, and film formation was performed. This film was dried at 55° C., so that a Nano MFC sheet having a fiber content of approximately 70% and a thickness of 43 μm was obtained.

Manufacturing Example 4

Manufacturing of MFC Sheet

A MFC sheet having a fiber content of approximately 70% and a thickness of 50 μm was obtained in the same manner as that in manufacturing example 3 except that the grinding treatment was not performed.

Examples 1 to 3

After the BC sheets obtained in manufacturing example 1 were immersed in resins shown in Table 3 for 12 hours under vacuum conditions (0.08 MPa), when the resin was a UV curable type, a sheet thus obtained was irradiated with UV rays for 8 minutes for curing the resin (after irradiation, heating was not performed). In addition, when the resin was a thermosetting type, a sheet thus obtained was air-dried for several hours, followed by hot pressing for 10 minutes at 150° C. under a pressure of 50 MPa. As a result, individual resin-composite BC sheets were obtained.

When the flexural strength and flexural modulus were measured, resin-composite BC sheets each having a thickness of 1 mm were used. A test sample for this measurement was prepared by laminating a required number of resin-composite BC sheets before resin curing and then performing the curing treatment described above.

The thicknesses and the fiber contents of the resin-composite BC sheets thus obtained are shown in Table 4. The fiber content was obtained by measuring the change in weight before and after the composition between the rein and the sheet was formed.

TABLE 3

| Example | Resin | Details |
|---|---|---|
| Example 1 | Phenol Resin | Methanol solution containing 40% of phenol PL4414 manufactured by Gunei Chemical Industry Co., Ltd. |
| Example 2 | Acrylic Resin A | No dilution<br>UV3000A manufactured by Mitsubishi Chemical Corp., UV curable type, Tg = 130° C., Tg = 130° C., Degree of crystallinity: 0% (No crystallinity) |
| Example 3 | Acrylic Resin B | No dilution<br>ARONIX UV3701 manufactured by Toagosei Co., Ltd., UV curable type, Tg = 250° C. or more, Degree of crystallinity: 0%, (No crystallinity) |

Example 4

The Nano MFC sheet obtained in manufacturing example 3 was impregnated with the acrylic resin B in the same manner as that in example 3, followed by UV irradiation for curing, so that an acrylic resin-composite Nano MFC sheet was obtained.

The thickness and the fiber content of the obtained resin-composite Nano MFC sheet are shown in Table 4.

Comparative Example 1

The disaggregated BC sheet obtained in manufacturing example 2 was impregnated with the acrylic resin B in the same manner as that in Example 3, followed by UV irradiation for curing, so that an acrylic resin-impregnated disaggregated BC sheet was obtained.

The thickness and the fiber content of the obtained resin-impregnated disaggregated BC sheet are shown in Table 4.

Comparative Example 2

The MFC sheet obtained in manufacturing example 4 was impregnated with the acrylic resin B in the same manner as that in example 3, followed by UV irradiation for curing, so that an acrylic resin-impregnated MFC sheet was obtained.

The thickness and the fiber content of the obtained resin-impregnated MFC sheet are shown in Table 4.

[Evaluation]

Figure 8:
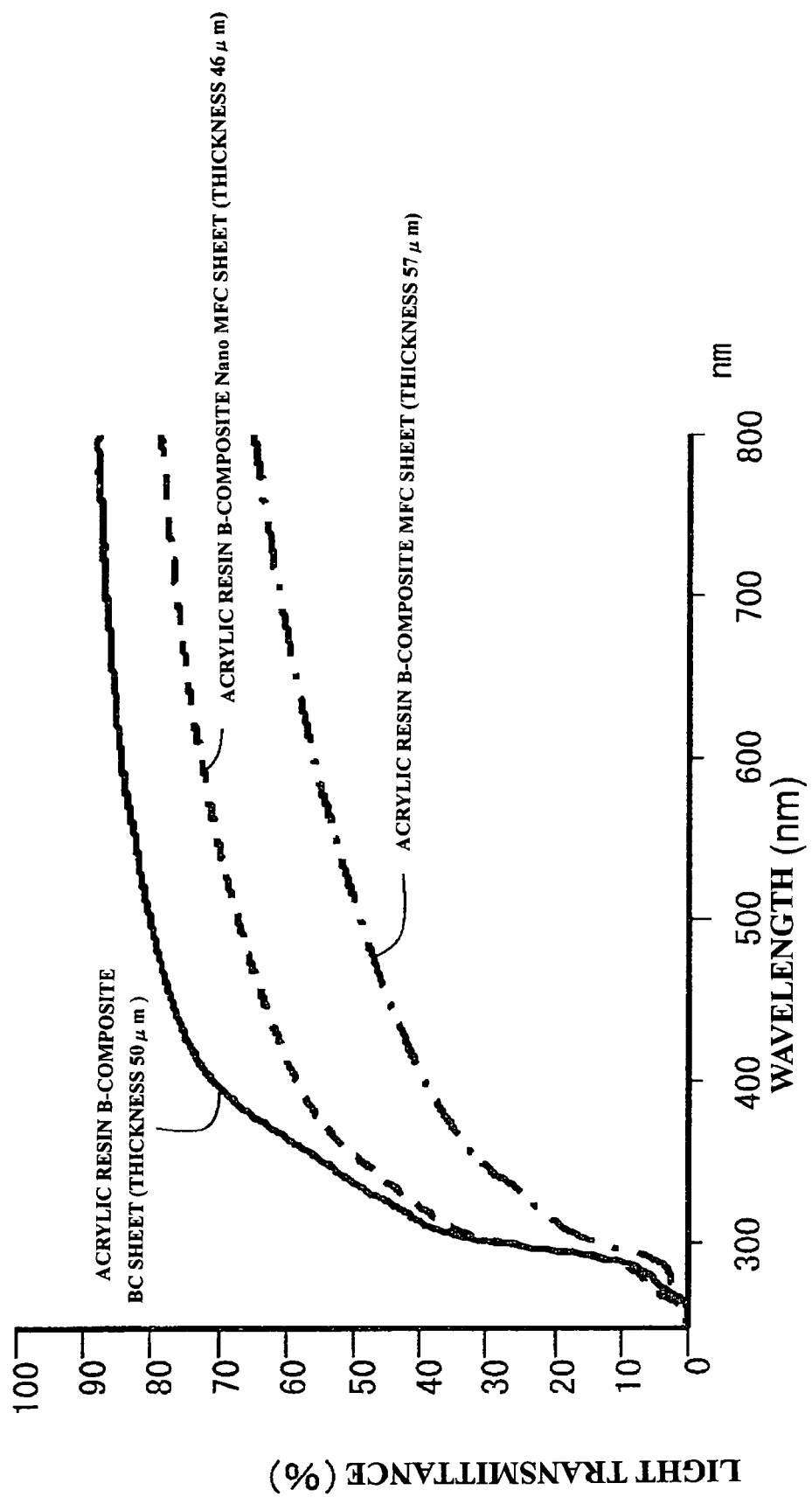
FIG. 8 is a graph showing light transmittances of various acrylic resin-composite sheets.
Figure 9:
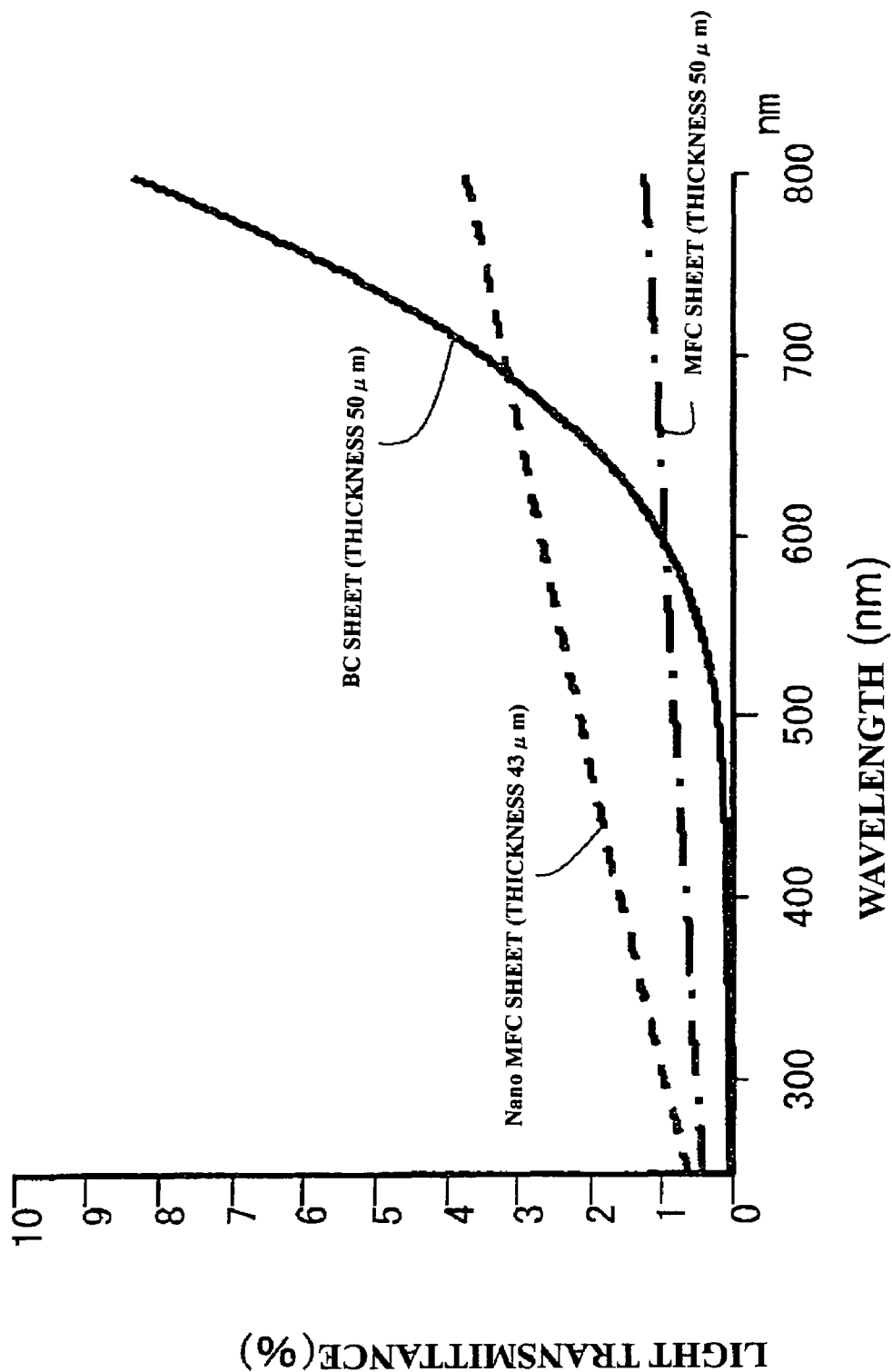
FIG. 9 is a graph showing light transmittances of various resin sheets before impregnation.
Figure 10:
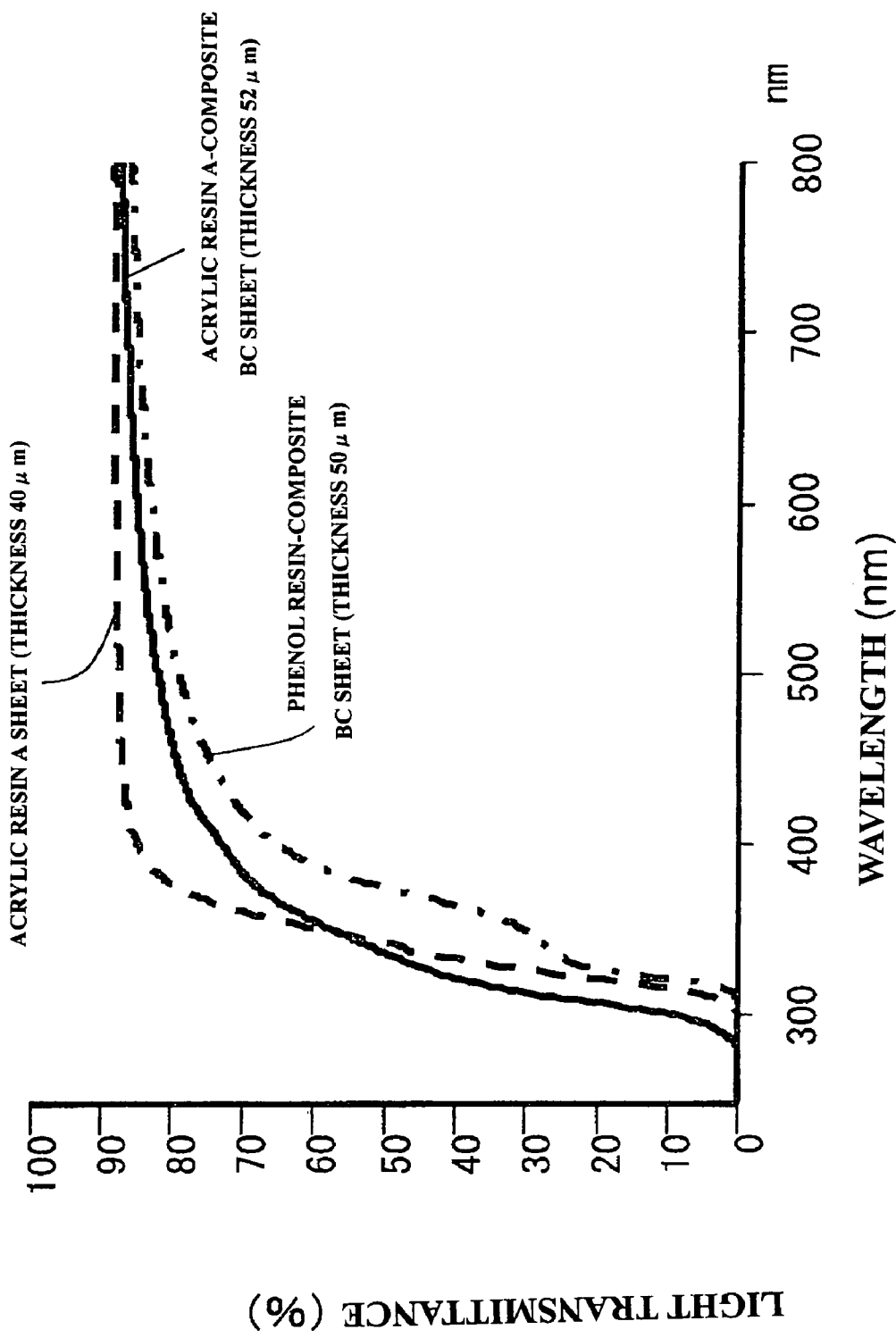
FIG. 10 is a graph showing light transmittances of an acrylic resin sheet and resin-composite BC sheets.

After the light transmittance was measured using the sheets shown in Table 4 below as samples, the results are shown in FIGS. 8 to 10, and in addition, after the 50 μm-thick visible light transmittance was calculated, the results are also shown in Table 4.

In addition, measurement results of the specific gravity, coefficient of linear thermal expansion, flexural strength, and flexural modulus of each resin-composite sheet are also shown in Table 4.

TABLE 4

| No. | Type | | Thickness (μm) | Fiber content (wt %) | 50 μm-thick visible light transmittance (%) | Specific gravity | Coefficient of linear thermal expansion (K−1) | Flexural strength (MPa) | Flexural modulus (GPa) | Remarks |
|---|---|---|---|---|---|---|---|---|---|---|
| 1 | Sheet before | BC sheet | 50 | — | 2.1 | 1.20 | $3 \times 10^{-6}$ | 250 | 18 | — |
| 2 | resin | Nano MFC sheet | 43 | — | 2.7 | 1.13 | $9 \times 10^{-6}$ | 180 | 10 | — |
| 3 | impregnation | MFC sheet | 50 | — | 0.9 | 0.90 | $10 \times 10^{-6}$ | 160 | 8 | — |
| 4 | Resin-composite | Phenol resin-composite BC sheet | 50 | 70 | 81.1 | 1.41 | $3 \times 10^{-6}$ | 420 | 28 | Example 1 |

TABLE 4-continued

| No. | Type | | Thickness (μm) | Fiber content (wt %) | 50 μm-thick visible light transmittance (%) | Specific gravity | Coefficient of linear thermal expansion (K−1) | Flexural strength (MPa) | Flexural modulus (GPa) | Remarks |
|---|---|---|---|---|---|---|---|---|---|---|
| 5 | sheet | Acrylic resin A-composite BC sheet | 52 | 70 | 83.8 | 1.42 | 6 × 10⁻⁶ | 400 | 25 | Example 2 |
| 6 | | Acrylic resin B-composite BC sheet | 50 | 70 | 83.0 | 1.41 | 7 × 10⁻⁶ | 400 | 25 | Example 3 |
| 7 | | Acrylic resin B-composite Nano MFC sheet | 46 | 70 | 71.4 | 1.42 | 12 × 10⁻⁶ | 300 | 17 | Example 4 |
| 8 | | Acrylic resin B-composite disaggregated BC sheet | 57 | 70 | 54.7 | 1.40 | 10 × 10⁻⁶ | 320 | 18 | Comparative Example 1 |
| 9 | | Acrylic resin B-composite MFC sheet | 57 | 70 | 54.7 | 1.40 | 14 × 10⁻⁶ | 280 | 15 | Comparative Example 2 |
| 10 | Resin sheet | Acrylic resin A sheet | 40 | 0 | 87.8 | 1.20 | 120 × 10⁻⁶ | 90 | 3 | — |

In FIG. 8, the light transmittances of various resin-composite sheets using the same acrylic resin are shown. As shown in FIG. 8, it is understood that the resin-composite sheets using the BC sheet and the Nano MFC sheet have a high light transmittance as compared to that of the resin-composite sheet using the MFC sheet, and that in particular, when the BC sheet is used, superior transparency can be obtained.

In FIG. 9, the light transmittances of the sheets before resin impregnation are shown. From FIG. 9, it is understood that before resin impregnation, the BC sheet, the MFC sheet, and the Nano MFC sheet are all opaque sheets in a similar way. In particular, although the MFC is processed by grinding treatment to form nanometer-order fibers, an opaque sheet is also obtained before the resin impregnation. However, when being impregnated with resins, only sheets (the BC sheet and the Nano MFC sheet) formed of nanometer-order fibers show transparency having a 50 μm-thick visible light transmittance of 60% or more.

In FIG. 10, the light transmittance of the resin-composite BC sheet composed of the BC sheet and an acrylic resin or a phenol resin and the light transmittance of an acrylic resin itself are shown. From FIG. 10, it is understood that even when the BC sheet is impregnated with the resin, the decrease in light transmittance is small, and as a result, a resin-composite BC sheet having superior transparency can be obtained.

In addition, from Table 4, the following are apparent.

It is understood that the resin-composite BC sheet of the present invention, which is composed of a resin and a BC sheet having a ≧4.5 μm RL ratio of 30% or less impregnated therewith, shows a small decrease in light transmittance even when the BC sheet is impregnated with a resin and that, in most (400 to 700 μm) of the visible light wavelength region, the above resin-composite BC sheet has a light transmittance of 60% or more and superior transparency. On the other hand, by a composite of a disaggregated BC sheet having a ≧4.5 μm RL ratio of more than 30% impregnated with a resin, sufficient transparency cannot be obtained.

The specific gravity of the resin-composite sheets of the present invention is 1.2 to 1.4, and hence compared to a glass fiber-reinforced polycarbonate or glass fiber-reinforced unsaturated polyester having a specific gravity of 1.6 to 1.7, the trend toward reduction in weight can be achieved.

The coefficient of linear thermal expansion of the resin-composite sheet of the present invention is $6 \times 10^{-6} K^{-1}$, and the coefficient of linear thermal expansion of an acrylic resin itself is approximately $1.2 \times 10^{-4} K^{-1}$. When a fiber-reinforced composite material was formed from the above two, the coefficient of linear thermal expansion could be decreased to 1/20, which was much lower than that expected based on the additivity of the matrix material and fibers. Accordingly, the resin-composite sheet can be effectively used for applications which require dimensional stability, such as large transparent plates including filters for display, screens for projection television, and frame member materials of movable bodies such as automobiles and electric trains, or for application, such as large optical components, in which strain and deformation caused by ambient temperature may result in problems.

The coefficient of linear thermal expansion of the BC sheet before resin impregnation was $2 \times 10^{-6}$ to $5 \times 10^{-6} K^{-1}$, and it was understood that the coefficient of linear thermal expansion of the BC sheet is smaller than that of the resin-composite sheet.

The resin-composite sheet of the present invention has a light transmittance of 60% or more in most (400 to 700 nm) of the visible light wavelength region and is transparent. On the other hand, by the MFC sheet and the disaggregated BC sheet, which are impregnated with the resin, superior transparency cannot be obtained.

The resin-composite sheet of the present invention also has a high flexural strength and a high flexural modulus.

The thermal conductivity of the acrylic resin-composite BC sheet obtained as described above was measured and was compared with that of the acrylic resin sheet material used as a base material. The measurement method was a light alternating current method, and in-plane thermal conductivity was measured. The results are as follows.

(1) Only acrylic resin sheet as a base material: 0.3 W/mK (in plane)

(2) Acrylic resin-composite BC sheet: 1 W/mK (in plane)

A thermal conductivity of 1 W/mK is equivalent to that of a quartz glass and is three times or more that of a common transparent resin material. For example, since the in-plane thermal conductivity of a common polyimide film is 0.6

W/mK (0.2 W/mK in the thickness direction) which is an actual measurement value by the method similar to that described above, it is understood that as a flexible resin-composite sheet, the resin-composite BC sheet of the present invention has a significantly high thermal conductivity.

Example 5

Acetylated BC Sheet

In the same manner as that in manufacturing example 1, a BC sheet having a thickness of approximately 50 µm was obtained. Immediately after being immersed in an acetic anhydride at 120° C. for 21 hours, this BC sheet was charged into water, so that reaction was stopped. Subsequently, washing was performed with running water for 2 days, and the BC sheet was allowed to stand in hot water at 70° C. for 1 hour. Next, after the BC sheet was sandwiched between pieces of filter paper, a small weight is put thereon, the filter paper is then replaced with dry filter paper, and subsequently, vacuum drying was performed at 50° C. It was confirmed by an infrared spectrum method (IR spectrum method) that this BC sheet is an acetylated BC sheet in which acetyl groups are introduced to hydroxyl groups of cellulose.

When the evaluation of the ≧4.5 µm RL ratio was performed for this acetylated bacterial cellulose in the same manner as that in analysis example 1, the same result as that of the bacterial cellulose before acetylation was obtained, and hence it was understood that the ≧4.5 µm RL ratio of the bacterial cellulose is not changed by acetylation.

This acetylated BC sheet was impregnated with the acrylic resin A in the same manner as that in example 2, and curing was performed by UV irradiation as described above, so that an acrylic resin-composite acetylated BC sheet having a fiber content of 70 percent by weight was obtained.

Figure 11:
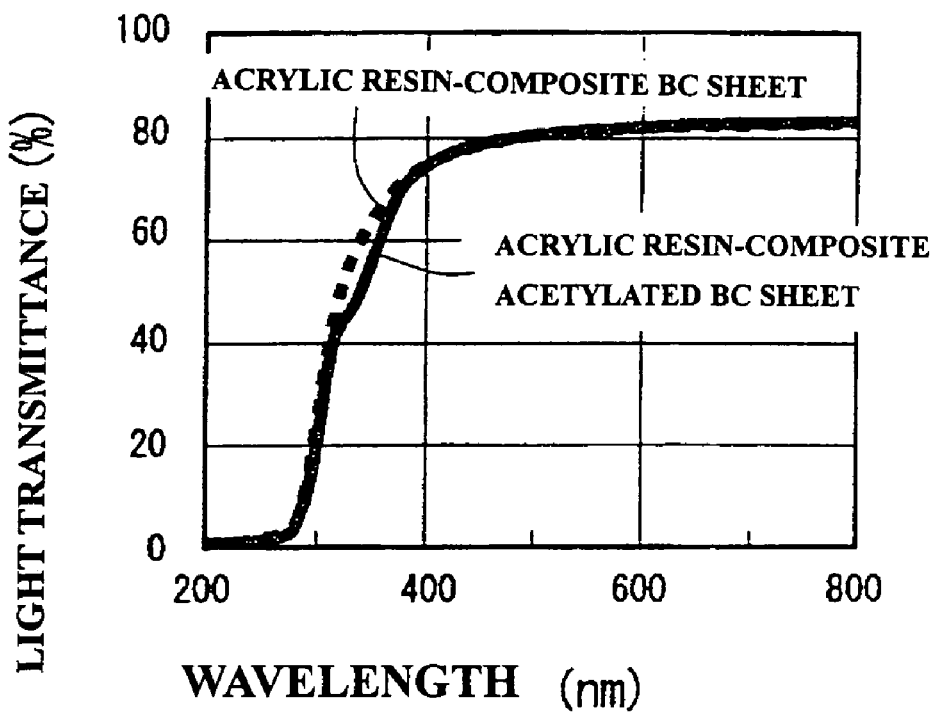
FIG. 11 is a graph showing light transmittances of an acrylic resin-composite BC sheet and an acrylic resin-composite acetylated BC sheet.

The light transmittances of the acrylic resin-composite BC sheet obtained in example 2 and this acrylic resin-composite acetylated BC sheet were measured, and the results are shown in FIG. 11.

As apparent from FIG. 11, an influence of the acetylation treatment on the light transmittance was slightly observed at a wavelength of approximately 350 nm; however, in the visible light region, no influence was observed at all. The 50 µm-thick visible light transmittance of this acrylic resin-composite acetylated BC sheet was 80%.

Next, after the acrylic resin-composite BC sheet obtained in example 2 and this acrylic resin-composite acetylated BC sheet were boiled in water at 100° C. for 1 hour, the changes in weight and sheet thickness before and after boiling were measured, and the results are shown in Table 5.

TABLE 5

Table 5-1
Change in weight of resin-composite sheet by boiling test

|  | Weight before boiling | Weight after boiling | Increase in weight (%) |
| --- | --- | --- | --- |
| Acrylic resin-composite BC sheet | 102.2 mg | 120.8 mg | increase of 28% |
| Acrylic resin-composite acetylated BC sheet | 150 mg | 160 mg | increase of 11% |

TABLE 5-continued

Table 5-2
Change in tickness of resin-composite sheet by boiling test

|  | Thickness before boiling | Thickness after boiling | Change in thickness (%) |
| --- | --- | --- | --- |
| Acrylic resin-composite BC sheet | 61.7 µm | 79.1 µm | increase of 18% |
| Acrylic resin-composite acetylated BC sheet | 87.8 µm | 97.8 µm | increase of 7% |

As apparent from Table 5, as for the rate of change in sheet weight by boiling for 1 hour, the non-acetylated acrylic resin-composite BC sheet had an increase of 28% and the acrylic resin-composite acetylated BC sheet had an increase of 11%. The rates of change in thickness were an increase of 18% and an increase of 7%, respectively. As described above, it is understood that by acetylation, the water-absorbing properties can be decreased to approximately ⅓.

Next, for the acrylic resin-composite BC sheet obtained in example 2, this acrylic resin-composite acetylated BC sheet, and the BC sheet before resin impregnation in manufacturing example 1, the rate of decrease in weight was measured using a thermogravimetric analyzer manufactured under the trade name "TGA2050" by TA Instruments. The measurement was performed by the steps of maintaining a sample at 100° C. for 30 minutes in a nitrogen atmosphere, then performing heating from 100 to 500° C. at a rate of 10° C./min, and the results are shown in FIG. 12.

Figure 12:
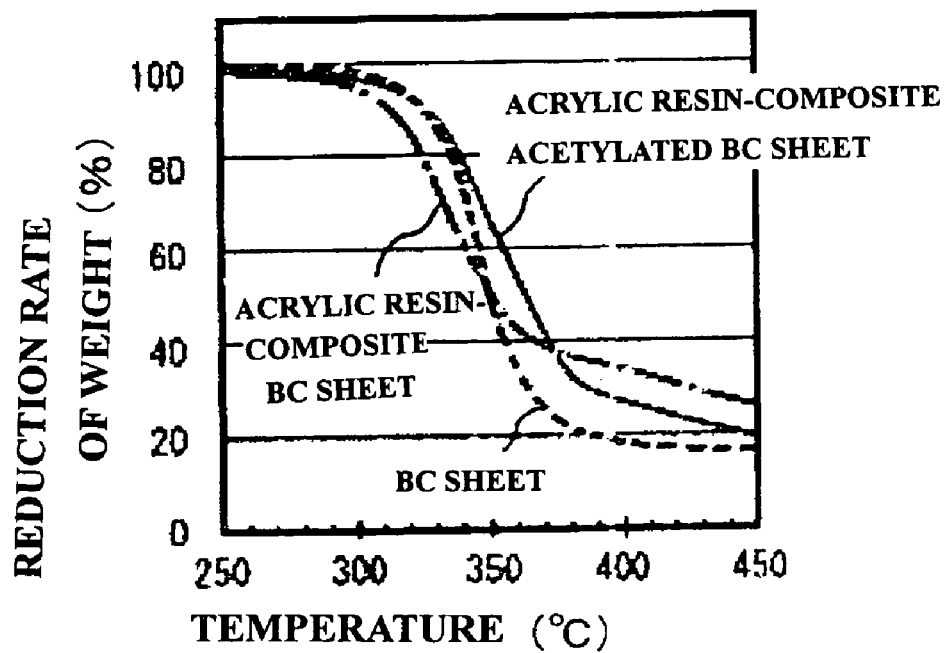
FIG. 12 is a graph showing heat stability test results (reduction rate in weight) of an acrylic resin-composite BC sheet, an acrylic resin-composite acetylated BC sheet, and a BC sheet.

As apparent from FIG. 12, a considerable decrease in weight of the acrylic resin-composite acetylated BC sheet started at a temperature higher than that of the acrylic resin-composite BC sheet by approximately 30° C., and it was understood that by acetylation, the heat stability is also improved.

Manufacturing Example 5

After *Acetobacter xylinum* FF-88 was inoculated into a culture fluid having a pH of 3.0 adjusted using acetic acid and including 7 percent by weight of coconut milk (0.7 percent by weight of total nitrogen component and 28 percent by weight of lipid) and 8 percent by weight of sucrose, stationary culture was performed for 5 days at 30° C., so that a primary culture fluid was obtained.

After a gel component was removed from the primary culture fluid thus obtained, a fluid component was added to a culture fluid similar to that described above at a ratio of 5 percent by weight, followed by stationary culture for 10 days at 30° C., thereby obtaining a secondary culture fluid. In this secondary culture fluid, approximately 1 percent by weight of cellulose fibers was contained.

The secondary culture fluid thus obtained was added to an aqueous sodium hydroxide solution at a concentration of 5 percent by weight and was boiled for 3 hours, so that the above bacteria were sterilized and removed. Next, a solid component was isolated by removing a water component, so that cellulose fibers were obtained containing 10 parts by weight of water. Subsequently, the fibers were provided between plates made of stainless steel and were cold-pressed under a compression pressure of 0.3 MPa, so that water was squeezed out of the fibers. Next, hot press was performed at a temperature of 120° C. under a pressure of 1 MPa, thereby forming a BC sheet of cellulose fibers (water content of 0 percent by weight), having a thickness of approximately 60 µm.

A scanning electron microscopic photograph (SEM photograph) of the BC sheet thus obtained was taken, and the image analysis was performed. As a result, it was confirmed that as is the case of FIG. 1, in the region having a longitudinal dimension of 51 µm and a lateral dimension of 65 µm, the presence of a three-dimensional intersection bacterial cellulose structural body was confirmed in which a fine network structure was formed from bacterial cellulose having an average fiber diameter of 50 nm.

In addition, the 50 µm-thick visible light transmittance of this BC sheet was 3%.

Example 6

The BC sheet obtained in manufacturing example 5 was immersed in a methanol solution containing 50 percent by weight of a UV curable epoxy resin (non-fluorinated adhesive for refractive index control (model No: AS-4, nD=1.52) manufactured by NTT Advanced Technology Corp.) and was allowed to stand for 12 hours under vacuum conditions (0.8 Torr). Subsequently, the vacuum pressure was returned to atmospheric pressure, and the immersion of the BC sheet thus treated was performed for 1 day at 20° C.

Next, the above sheet was recovered from the methanol solution and was then air-dried to remove methanol, followed by UV irradiation for 5 minutes, so that the resin was cured. Then, heating was performed at 90° C. for 10 minutes so as to complete resin curing, and as a result, a resin-impregnated BC sheet having a thickness of approximately 85 µm was obtained.

When the weight of the sheet before and after resin impregnation was measured, the rate of increase in weight by the resin impregnation was 60%. That is the resin content of the obtained resin-impregnated sheet was 38%, and the content of the cellulose fibers was 62%.

By using the above resin-impregnated sheet thus obtained, the above evaluation was performed, and the results are described below.

The specific gravity of the above resin-impregnated sheet was 1.4. Since a glass fiber-reinforced polycarbonate or a glass fiber-reinforced unsaturated polyester, which is commonly used, has a specific gravity of 1.6 to 1.7, the trend toward reduction in weight can be achieved.

The coefficient of linear thermal expansion of the above resin-impregnated BC sheet was $6 \times 10^{-6} K^{-1}$. The coefficient of linear thermal expansion of an epoxy resin itself is approximately $1.5 \times 10^{-4} K^{-1}$, and when a composite resin was formed therefrom, the coefficient of linear thermal expansion could be decreased to 1/20, which was much lower than that expected based on the additivity of the matrix material and fibers. Accordingly, the above composite resin can be effectively used for applications which require dimensional stability, such as large transparent plates including filters for display, screens for projection television, and frame member materials of movable bodies such as automobiles and electric trains, or for application, such as large optical components, in which strain and deformation caused by ambient temperature may result in problems.

The coefficient of linear thermal expansion of the BC sheet before resin impregnation is $2 \times 10^{-6}$ to $5 \times 10^{-6} K^{-1}$, and it was understood that the coefficient of linear thermal expansion of a bundle of the cellulose fibers is smaller than that of the resin-impregnated BC sheet.

The above resin-impregnated sheet has a 50 µm-thick visible light transmittance of 80%, and it became apparent that the above sheet is transparent.

Figure 13:
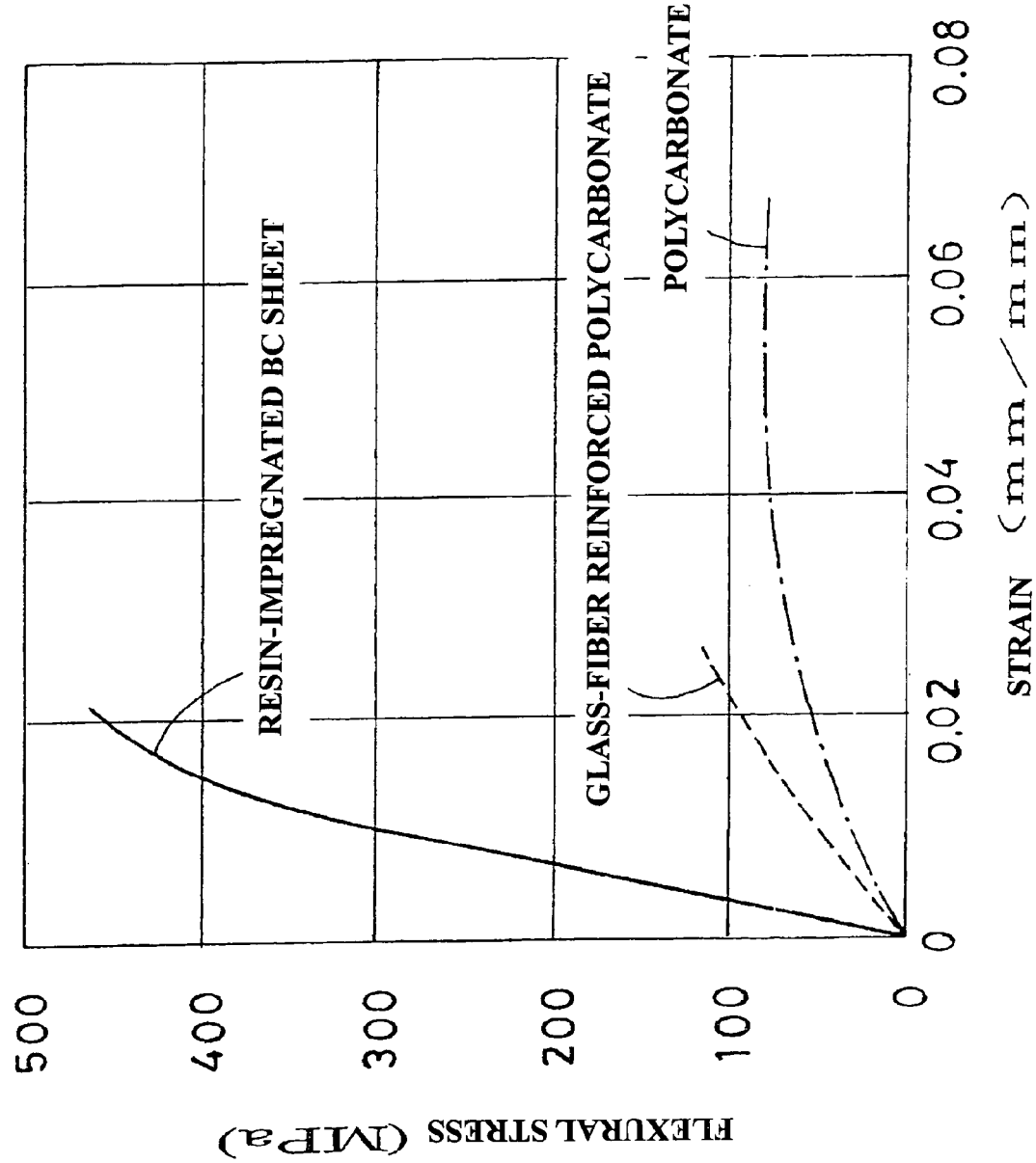
FIG. 13 is a graph showing the relationship between the flexural stress (MPa) and the strain (mm/mm) of a resin-impregnated BC sheet obtained in example 6 and of samples prepared for the purpose of comparison.

The measurement results of the flexural strength of the above resin-impregnated sheet are shown in FIG. 13. In addition, for the purpose of comparison, the results of a polycarbonate resin (manufactured under the trade name "Novalex 7022A by Mitsubishi Chemical Corp.) and a glass fiber-reinforced polycarbonate (manufactured under the trade name "Iupilon GS-2030 MR2", containing 30% of glass fibers, by Mitsubishi Engineering-Plastics Corp.) are also shown.

As a result, it was understood that the resin-impregnated BC sheet has a high flexural strength, approximately 4 to 10 times that of a polycarbonate and a glass fiber-reinforced polycarbonate, which are generally regarded as a product having a high flexural strength.

Examples 7 to 9

On one surface of each of resin-composite BC sheets (thickness: 60 µm) obtained in manners similar to those of examples 1, 2, and 5, an IZO transparent conductive film having a thickness of 110 nm was formed by DC magnetron sputtering under the following conditions, so that the transparent multilayered sheets of the present invention were obtained. The specific resistances of the transparent multilayered sheets thus formed were measured, and the results are shown in Table 6.

<Film Forming Conditions>
Target material: $InO_3$—$ZnO$ (composition ratio (percent by weight): approximately 90:10)
Reaction gas: $Ar/O_2$
Reaction pressure: 0.3 Pa
Sputtering output: 1.2 W/cm$^2$
Substrate temperature: 23° C.

The light transmittance of each of the transparent multilayered sheets was measured, and in the case in which the multilayered sheet was irradiated with light having a wavelength of 400 to 700 nm in the thickness direction, the average value of the light transmittance in the entire wavelength region was as shown in Table 6.

After a load, i.e., the change in temperature, was applied to a sample under the following conditions (1), the change in specific resistance and the presence or absence of deformation (a. presence or absence of strain in heating and in cooling, b. the degree of thickness by deformation on a flat surface of a sample having a size of 10 cm square) were examined, and the results are shown in Table 6.

After a load, i.e., the tensile stress, was applied to a sample under the following conditions (2), the change in specific resistance was examined, and the results are shown in Table 6.

(1) A heating and cooling test was repeated 5 times at a rate of approximately 50° C./min, in which temperatures of 20° C., 150° C., and 20° C. were changed in that order.
(2) A tensile stress of up to 500 g was applied to a sample in the form of a tape having a thickness of 50 µm, a length of 100 mm, and a width of 25 mm, and subsequently, the tensile stress was repeatedly released and applied 5 times.

Comparative Example 3

After an IZO transparent conductive film (specific resistance: $4.2 \times 10^4$ Ω·cm) was formed on a glass base material having a thickness of 0.7 mm in the same manner as that in example 7, the base material was irradiated with light having a wavelength of 400 to 700 nm in the thickness direction, and the average light transmittance in the entire wavelength region was measured. The result is shown in Table 6.

Comparative Example 4

After an IZO transparent conductive film was formed on an extrusion-molded polycarbonate film having a thickness of 100 μm in the same manner as that in example 7, the specific resistance, the change in specific resistance and the presence or absence of deformation after application of the load, i.e., the change in temperature, and the change in specific resistance after application of the tensile stress were measured. The results are shown in Table 6.

the trade name "Epicoat828" by Yuka Shell K. K), 11.4 parts by weight of methaphenylenediamine (Wako Pure Chemical Industries, Ltd.) functioning as a curing agent and 0.2 parts by weight of 1-cyanoethyl-2-ethyl-4-methylimidazole (manufactured under the trade name "2E4MZ•CN" by Shikoku Chemicals Corp.) functioning as a curing promoter were dissolved in methyl ethyl ketone. A solid component concentration of the varnish was set to 50 percent by weight. In the warmish thus obtained, after the MFC sheet was immersed, drying was performed at 110° C. for 5 minutes and 120° C. for 5 minutes to remove the solvent, thereby forming a prepreg. The content of the resin thus impregnated was 56 percent by

TABLE 6

| | Type of base material | Average value of light transmittance (%) | Specific resistance ($\times 10^4 \, \Omega \cdot cm$) | After application of load, change in temperature | | After application of load, tensile stress Change in specific resistance |
|---|---|---|---|---|---|---|
| | | | | Change in specific resistance | Presence or absence of deformation | |
| Example 7 | Acrylic resin-composite BC sheet | 80 | 4.2 | No | a. No strain, b. floating of 2 mm or less | No |
| Example 8 | Phenol resin-composite BC sheet | 79 | 4.2 | No | a. No strain, b. floating of 2 mm or less | No |
| Example 9 | Acrylic resin-composite acetylated BC sheet | 80 | 4.2 | No | a. No strain, b. floating of 2 mm or less | No |
| Comparative Example 3 | Glass | 90 | — | — | — | — |
| Comparative Example 4 | Polycarbonate film | — | 4.2 | increase of 20% | a. Presence of strain, b. floating of approximately 5 cm | increase of approximately 2 times |

According to the results described above, it becomes apparent that the transparent multilayered sheet of the present invention has superior transparency, is lighter in weight and more flexible than a glass substrate, has superior impact resistance, and has no problems of deformation and decrease in conductivity, which are caused by change in temperature and/or stress application, and that the transparent multilayered sheet described above can be effectively applied to applications in which besides superior transparency and conductivity, weatherability and durability against mechanical stress are required.

Example 10

Circuit Board

<Formation of Nano MFC Sheet>
A Nano MFC sheet having a fiber content of 70% and a thickness of 55 μm was formed in the same manner as that in manufacturing method 3. The obtained MFC sheet was further compressed by applying a pressure so as to have a thickness of 50 μm. The pressure was set to 30 kgf/cm² (2.9 MPa).

<Formation of Prepreg>
The Nano MFC sheet thus obtained was impregnated with a varnish containing an epoxy resin by immersion coating as described below, so that a resin-impregnated Nano MFC sheet (prepreg) was formed.

The varnish was obtained such that, relative to 100 parts by weight of bisphenol A type epoxy resin (manufactured under weight of the total prepreg. In addition, the 50 μm-thick visible light transmittance of this prepreg was 65%.

<Copper Clad Laminate>
Copper foils (18 μm thick, manufactured by Nippon Denkai, Ltd.) were placed on two surfaces of the prepreg thus formed and were then pressure bonded by a press, so that a copper clad laminate was obtained. The press conditions were such that the temperature was increased from room temperature to 170° C. at a rate of 10° C./min under a pressure of 30 kgf/cm² (2.9 MPa), and pressure bonding was further performed at 170° C. for 60 minutes.

<Formation of Inner-Layer Circuit Board>
In order to electrically connect between the top and the bottom of a board, at least one hole was formed at a predetermined position, and the inside wall of the hole is further plated, so that at least one through-hole was formed. Furthermore, predetermined wiring circuits were formed on conductive positions provided on the two surfaces by resist exposure, development, and etching steps, so that an inner-layer circuit board was obtained.

<Formation of Multilayer Circuit Board>
By using a plurality of the above inner-layer circuit boards (in this example, three boards were used) and two copper foils to be used as outermost layers, a multilayer board was formed by thermal bonding by a press using the prepregs as an adhesive layer. The press conditions were such that the temperature was increased from room temperature to 170° C. at a rate of 10° C./min under a pressure of 15 kgf/cm² (1.5 MPa), and pressure bonding was then further performed at 170° C. for 60 minutes. In order to electrically connect between layers of the obtained multilayer board, at least one penetrating hole was formed at a predetermined position, and the inside wall of the hole is further plated, so that at least one through-hole was formed. Furthermore, predetermined wiring circuits were formed on conductive positions of the outermost layers by resist exposure, development, and etching steps, so that a multilayer circuit board was finally obtained.

Insulating layer portions of the obtained multilayer circuit board are all transparent, and hence the wiring circuits formed inside using a copper conductor can be observed from the outside.

The measurement results of properties of the obtained circuit board are shown in Table 7.

Example 11

Circuit Board

<Formation of BC Sheet>

A sheet (1 cm thick) of nata de coco containing bacterial cellulose (average fiber diameter: 50 nm) was compressed by application of a pressure using a cold press to have a thickness of 100 μm. The pressure was set to 3 kgf/cm$^2$ (2.9 MPa). After the compression, drying was performed at 70° C. for 15 hours, so that a BC sheet having a fiber content of 70% and a thickness of 50 μm was obtained.

<Formation of Inner-Layer Board for Built-In-Capacitor>

After prepregs (having a resin content of 70 percent by weight and a 50 μm-thick visible light transmittance of 75%), copper clad laminates, and inner-layer circuit boards were formed using the BC sheets described above in the same manner as that in example 10, in order to form an built-in capacitor, inner-layer circuit boards were formed using a resin having a high dielectric constant as an insulating layer separately from the above boards.

A varnish for the resin having a high dielectric constant was obtained by dissolving 40 parts by weight of bisphenol A type epoxy resin (Epicoat828 manufactured by Yuka Shell K. K.), 4.6 parts by weight of methaphenylenediamine (Wako Pure Chemical Industries, Ltd.) functioning as a curing agent, and 0.08 parts by weight of 1-cyanoethyl-2-ethyl-4-methylimidazole (manufactured under the trade name "2E4MZ•CN" by Shikoku Chemicals Corp.) functioning as a curing promoter, which were used in example 10, were dissolved in methyl ethyl ketone relative to 60 parts by weight of barium titanate (manufactured by Toho Titanium Co., Ltd., average particle diameter of 0.2 μm). As the varnish concentration, the solid component was set to 80 percent by weight. The varnish thus obtained was applied to one surface of a copper foil (18 μm thick, manufactured by Nippon Denkai, Ltd.) to form a layer having an average thickness of 28 μm, followed by hot wind drying at 80° C. for 10 minutes, so that the solvent was removed. Furthermore, on the surface onto which the varnish was applied, another copper foil (18 μm thick, manufactured by Nippon Denkai, Ltd.) was provided, and in the same manner as that for a common copper clad laminate, thermal bonding was performed by a press, so that a two-side copper-clad laminate was obtained. The press conditions were set such that the pressure was applied so as to control the thickness, the temperature was increased from room temperature to 170° C. at a rate of 10° C./min, and pressure bonding was then further performed at 170° C. for 60 minutes. The thickness was set to 20 μm. The capacitance of the built-in capacitor was determined by electrode areas formed on the two copper foils. In order to obtain a predetermined capacitance, and also in consideration of connection between capacitors, formation of inductance; and the like, predetermined wiring circuit patterns including electrodes were formed by resist exposure, development, and etching steps, so that the built-in-capacitor inter-layer board was formed.

<Formation of Multilayer Circuit Board>

By using the two inner-layer circuit boards, and the two inner-layer boards for built-in-capacitor, and two copper foils to be used as outermost layers, a multilayer board was formed by thermal bonding by a press using the prepregs as an adhesive layer. The press conditions were such that the temperature was increased from room temperature to 170° C. at a rate of 10° C./min under a pressure of 15 kgf/cm$^2$ (1.5 MPa), and pressure bonding was then further performed at 170° C. for 60 minutes. In order to electrically connect between layers of the obtained multilayer board, at least one penetrating hole was formed at a predetermined position, and the inside wall of the hole is further plated, so that at least one through-hole was formed. Furthermore, predetermined wiring circuits were formed on conductive positions of the outermost layers by resist exposure, development, and etching steps, so that a multilayer circuit board having built-in capacitors was finally obtained.

The capacitor formed inside this multilayer circuit board thus formed could be observed from the outside, and after components were mounted on the board, in accordance with confirmation of properties, trimming of the built-in capacitor could be easily performed by using laser or the like. In addition, as was the case of the capacitor, since the shape and the position of an inductor could also be observed from the outside, trimming could also be easily performed by laser or the like.

The measurement results of the properties of the obtained circuit board are shown in Table 7.

Example 12

Circuit Board

<Forming of Nano MFC Sheet>

A pulp fiber slurry was sheared 50 times using a homogenizer and was then defiberized (by grinding or ultra grinding) 30 times using a grinder, so that Nano MFC (average fiber diameter: 50 nm) was obtained. After this Nano MFC was dispersed in water at a ratio of 0.2 percent by weight, the dispersion was processed by filtration using a glass filter, and a film was then formed. Subsequently, drying of the film was performed at 55° C. to form a sheet having a thickness of 70 μm.

By using this Nano MFC sheet, as was the case of example 10, a multilayer board was formed.

Measurement results of properties of an obtained circuit board are shown in Table 7. In this example, the resin content of the prepreg using this Nano MFC sheet was 30 percent by weight, and the 50 μm-thick visible light transmittance was 70%.

TABLE 7

| Properties | | Example 10 | Example 11 | Example 12 |
|---|---|---|---|---|
| Mechanical properties (room temperature) | Flexural strength (MPa) | 300 | 499 | 320 |
| | Flexural modulus (GPa) | 18 | 5 | 18 |
| Coefficient of linear thermal expansion (×10$^{-6}$ K$^{-1}$) | | 7 | 9 | 8 |

TABLE 7-continued

| Properties | | Example 10 | Example 11 | Example 12 |
|---|---|---|---|---|
| Electrical properties @1 GHz | Relative dielectric constant | 2.9 | 3.0 | 2.8 |
| | Dielectric dissipation factor | 0.032 | 0.030 | 0.027 |
| Coefficient of water absorption (25° C./24 hours) | | 0.28 | 0.25 | 0.29 |

As shown in Table 7, it is understood that the boards obtained in the above examples have a high strength, a high modulus, and superior mechanical properties. Accordingly, the following effects can be obtained.

(1) When the flexural modulus of the board is low, as the thickness is decreased, flexure is liable to be generated in a package manufacturing step or in a component mounting step, and as a result, workability and reliability are seriously degraded. When the flexural modulus is high as is the case of the examples, although the thickness is decreased, the amount of flexure is small, and hence high density mounting and reduction in cost can be advantageously achieved.

(2) Besides two-side mounting, also in the case of one-side mounting, when the modulus is high, warping is not frequently generated, and hence various mounting structures can be formed.

(3) A board having high strength properties is able to mount many components thereon and to prevent the generation of defects such as cracking even in various reliability tests, for example, in which samples are processed by temperature cycle or heat shock and are allowed to stand in high temperature circumstances.

The board obtained in the above examples is suitably used as a thin packaging substrate, and high density mounting can be performed.

A conventional common board composed of a resin together with at least one glass cloth has a coefficient of linear thermal expansion of approximately 15 to 20 ppm/K. On the other hand, the coefficient of linear thermal expansion of a semiconductor chip (silicon) is 3 to 4 ppm/K, and hence, when the chip is directly mounted, in order to reduce a thermal stress generated by a large difference in coefficient of linear thermal expansion, an underfill agent is generally filled. Since the coefficient of linear thermal expansion of the boards obtained in the above examples is 10 ppm/K or less as shown in Table 7 and is very close to that of the chip, the thermal stress can be reduced, and hence higher reliability can be realized. In some cases, an underfill agent may not be required, and as a result, cost reduction can be further realized.

Since the relative dielectric constant and the dielectric dissipation factor at 10 GHz of the boards of the above examples are low, such as 3 or less and 0.032 or less, respectively, superior dielectric properties are obtained. According to the boards of the examples, since the relative dielectric constant can be decreased, faster transmission can be realized, and in addition, since the dielectric dissipation factor can be decreased, signal transmission can be performed without loss up to a higher frequency region.

The invention claimed is:

1. A fiber-reinforced composite material comprising: a matrix material; and fibers having an average fiber diameter of 4 to 200 nm, wherein the coefficient of linear thermal expansion is in the range of $0.05 \times 10^{-5}$ to $5 \times 10^{-5} K^{-1}$, wherein a light transmittance at a wavelength of 400 to 700 nm is 60% or more, which is a conversion value based on a thickness of 50 µm.

2. The fiber-reinforced composite material according to claim 1, wherein the fibers are cellulose fibers.

3. The fiber-reinforced composite material according to claim 2, wherein the cellulose fibers are chemically modified and/or physically modified.

4. The fiber-reinforced composite material according to claim 3, wherein the cellulose fibers are acetylated.

5. The fiber-reinforced composite material according to claim 2, wherein the cellulose fibers are bacterial cellulose.

6. The fiber-reinforced composite material according to claim 5, wherein the bacterial cellulose is not processed by disaggregation.

7. The fiber-reinforced composite material according to claim 6, wherein the bacterial cellulose has a three-dimensional intersection structure.

8. The fiber-reinforced composite material according to claim 5, wherein the bacterial cellulose is bacterial cellulose obtained by removing bacteria by an alkaline treatment of a product containing the bacteria and cellulose formed from the bacteria and connected thereto.

9. The fiber-reinforced composite material according to claim 2, wherein the cellulose fibers are isolated from vegetable fibers.

10. The fiber-reinforced composite material according to claim 9, wherein the cellulose fibers are fibers obtained by further grinding microfibrillated cellulose fibers.

11. The fiber-reinforced composite material according to claim 1, wherein the content of the fibers is 10 percent by weight or more.

12. The fiber-reinforced composite material according to claim 1, wherein the flexural strength is 30 MPa or more.

13. The fiber-reinforced composite material according to claim 1, wherein the specific gravity is in the range of 1.0 to 2.5.

14. The fiber-reinforced composite material according to claim 1, wherein the matrix material is an organic polymer, an inorganic polymer or a hybrid polymer containing an inorganic polymer and an organic polymer.

15. The fiber-reinforced composite material according to claim 14, wherein the matrix material is a synthetic polymer.

16. The fiber-reinforced composite material according to claim 15, wherein the matrix material is a synthetic resin having a degree of crystallinity of 10% or less and a glass transition temperature of 110° C. or more.

* * * * *